(12) United States Patent
Cheng et al.

(10) Patent No.: US 11,710,737 B2
(45) Date of Patent: Jul. 25, 2023

(54) HYBRID SEMICONDUCTOR DEVICE

(71) Applicant: Taiwan Semiconductor Manufacturing Company, Ltd., Hsinchu (TW)

(72) Inventors: Jung-Chien Cheng, Tainan (TW); Kuo-Cheng Chiang, Hsinchu County (TW); Shi Ning Ju, Hsinchu (TW); Guan-Lin Chen, Hsinchu County (TW); Chih-Hao Wang, Hsinchu County (TW); Kuan-Lun Cheng, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 154 days.

(21) Appl. No.: 17/226,851

(22) Filed: Apr. 9, 2021

(65) Prior Publication Data
US 2022/0254776 A1  Aug. 11, 2022

Related U.S. Application Data

(60) Provisional application No. 63/146,036, filed on Feb. 5, 2021.

(51) Int. Cl.
| H01L 27/088 | (2006.01) |
| H01L 29/423 | (2006.01) |
| H01L 29/06 | (2006.01) |
| H01L 29/66 | (2006.01) |
| H01L 21/8234 | (2006.01) |
| H01L 29/786 | (2006.01) |

(52) U.S. Cl.
CPC .... H01L 27/088 (2013.01); H01L 21/823418 (2013.01); H01L 21/823481 (2013.01); H01L 29/0665 (2013.01); H01L 29/42392 (2013.01); H01L 29/66742 (2013.01); H01L 29/78645 (2013.01); H01L 29/78696 (2013.01)

(58) Field of Classification Search
CPC ........... H01L 27/0886; H01L 29/0673; H01L 29/78696; H01L 29/0653; H01L 29/42392
See application file for complete search history.

(56) References Cited

U.S. PATENT DOCUMENTS

| 9,818,872 | B2 | 11/2017 | Ching et al. |
| 9,887,269 | B2 | 2/2018 | Ching et al. |
| 9,899,398 | B1 | 2/2018 | Colinge et al. |
| 10,032,627 | B2 | 7/2018 | Lee et al. |

(Continued)

FOREIGN PATENT DOCUMENTS

| DE | 102018103075 A1 | 2/2019 |
| KR | 20200014235 A | 2/2020 |

*Primary Examiner* — Changhyun Yi
(74) *Attorney, Agent, or Firm* — Haynes and Boone, LLP

(57) ABSTRACT

Semiconductor devices and method of forming the same are provided. In one embodiment, a semiconductor device includes a first transistor and a second transistor. The first transistor includes two first source/drain features and a first number of nanostructures that are stacked vertically one over another and extend lengthwise between the two first source/drain features. The second transistor includes two second source/drain features and a second number of nanostructures that are stacked vertically one over another and extend lengthwise between the two second source/drain features.

20 Claims, 37 Drawing Sheets

(56) References Cited

U.S. PATENT DOCUMENTS

| | | |
|---|---|---|
| 10,109,646 B1 | 10/2018 | Badaroglu |
| 10,109,721 B2 | 10/2018 | Lin et al. |
| 10,157,799 B2 | 12/2018 | Ching et al. |
| 10,170,484 B1 | 1/2019 | Sung |
| 10,199,502 B2 | 2/2019 | Huang et al. |
| 10,290,546 B2 | 5/2019 | Chiang et al. |
| 10,475,902 B2 * | 11/2019 | Lee et al. |
| 2014/0151639 A1 * | 6/2014 | Chang ................ H01L 29/0673 257/27 |
| 2017/0373163 A1 | 12/2017 | Vellianitis et al. |
| 2018/0122703 A1 | 5/2018 | Cheng et al. |
| 2018/0175036 A1 | 6/2018 | Ching et al. |
| 2019/0378934 A1 | 12/2019 | Hsiao |
| 2020/0006333 A1 | 1/2020 | Noh et al. |
| 2020/0044060 A1 | 2/2020 | Cheng |
| 2020/0066839 A1 | 2/2020 | Zhang |
| 2020/0098879 A1 | 3/2020 | Lee et al. |
| 2020/0303521 A1 | 9/2020 | Son et al. |
| 2020/0343376 A1 | 10/2020 | Chiang et al. |

\* cited by examiner

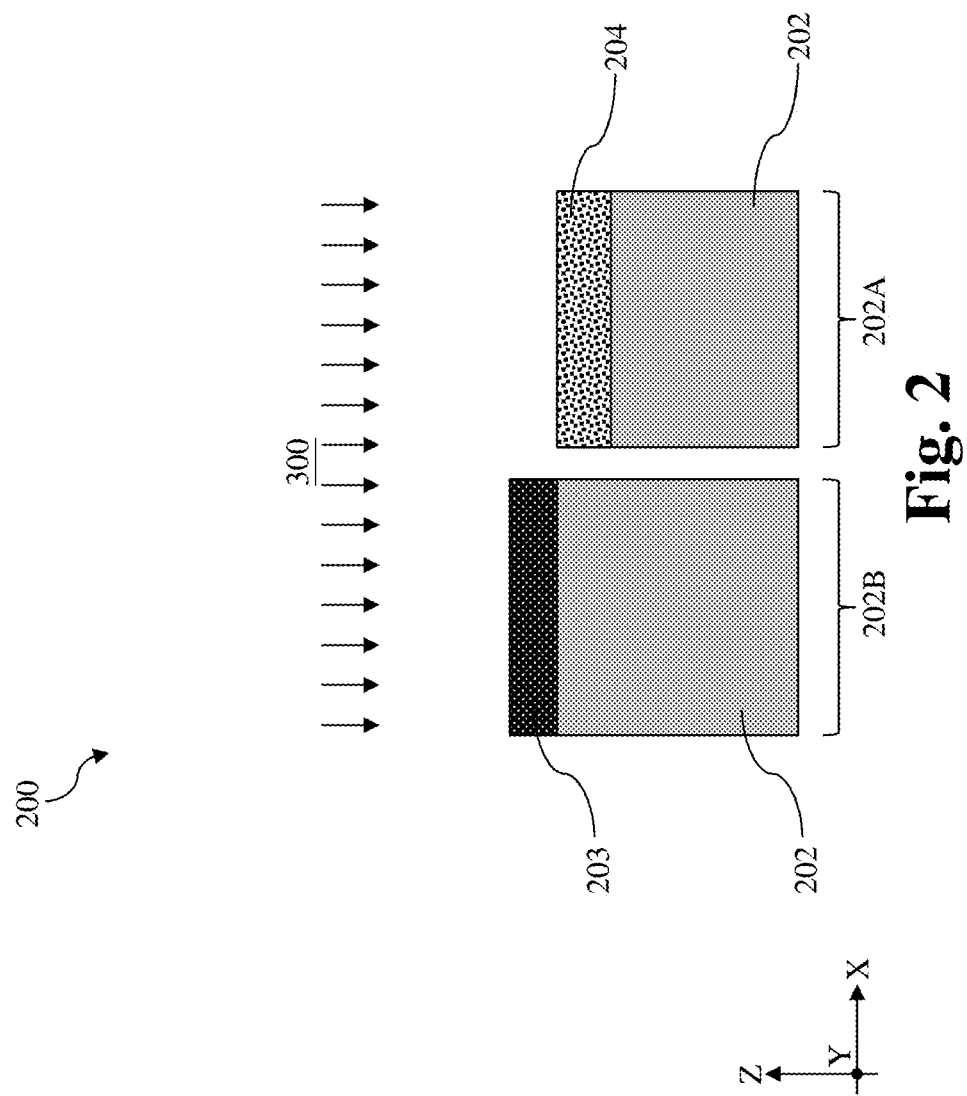

HYBRID SEMICONDUCTOR DEVICE

PRIORITY DATA

This application claims priority to U.S. Provisional Patent Application No. 63/146,036, filed on Feb. 5, 2021, entitled "Hybrid Semiconductor Device" the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate metal-oxide-semiconductor field effect transistor (multi-gate MOSFET, or multi-gate devices) have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. A multi-bridge-channel (MBC) transistor is an example of multi-gate devices. An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor.

MBC transistors with different configurations may be suitable for different circuit functions due to their different performance characteristics. While existing MBC transistors and methods for forming MBC transistors are generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2-30 illustrate fragmentary cross-sectional views of a workpiece during various fabrication stages in the method of FIGS. 1A and 1B, according to one or more aspects of the present disclosure.

DETAILED DESCRIPTION

Figure 1A:
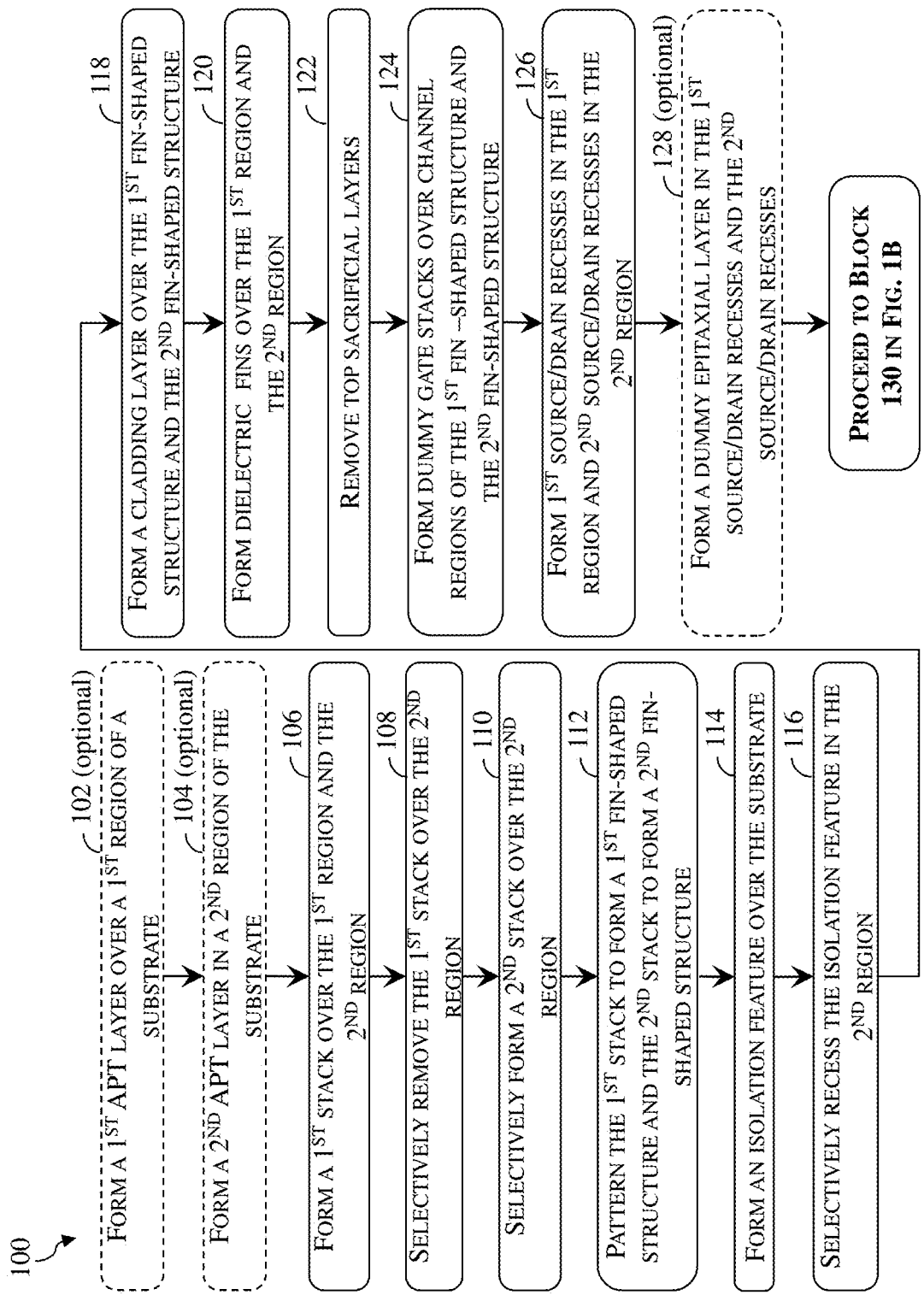
FIGS. 1A and 1B collectively illustrate a flowchart of a method for forming a semiconductor device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

An MBC transistor may include a plurality of channel members to serve as the channel and a gate structure that wraps around each of the channel members. The channel members may come in the forms of nanowires, nanosheets, nanorods, or other nanostructures. MBC transistors with different number of channel members have different attributes. For example, an MBC transistor having two channel members may be compared to an MBC transistor having three channel members. The additional channel member of the 3-channel-member MBC transistor may help boost the On-state current but the increased overlap between the gate structure and the drain may lead to increased parasitic capacitance and slower speed. The 2-channel-member MBC transistor has a smaller On-state current but has a smaller parasitic capacitance. It can be seen that 3-channel-member MBC transistor is more suitable for high-current applications while the 2-channel-member MBC transistor is more suitable for high speed alternative current (AC) applications. The present disclosure provides methods to form a hybrid device that includes MBC transistors having different numbers of channel members. Methods of the present disclosure address various process challenges in forming different MBC transistors in different regions of a substrate.

Figure 1B:
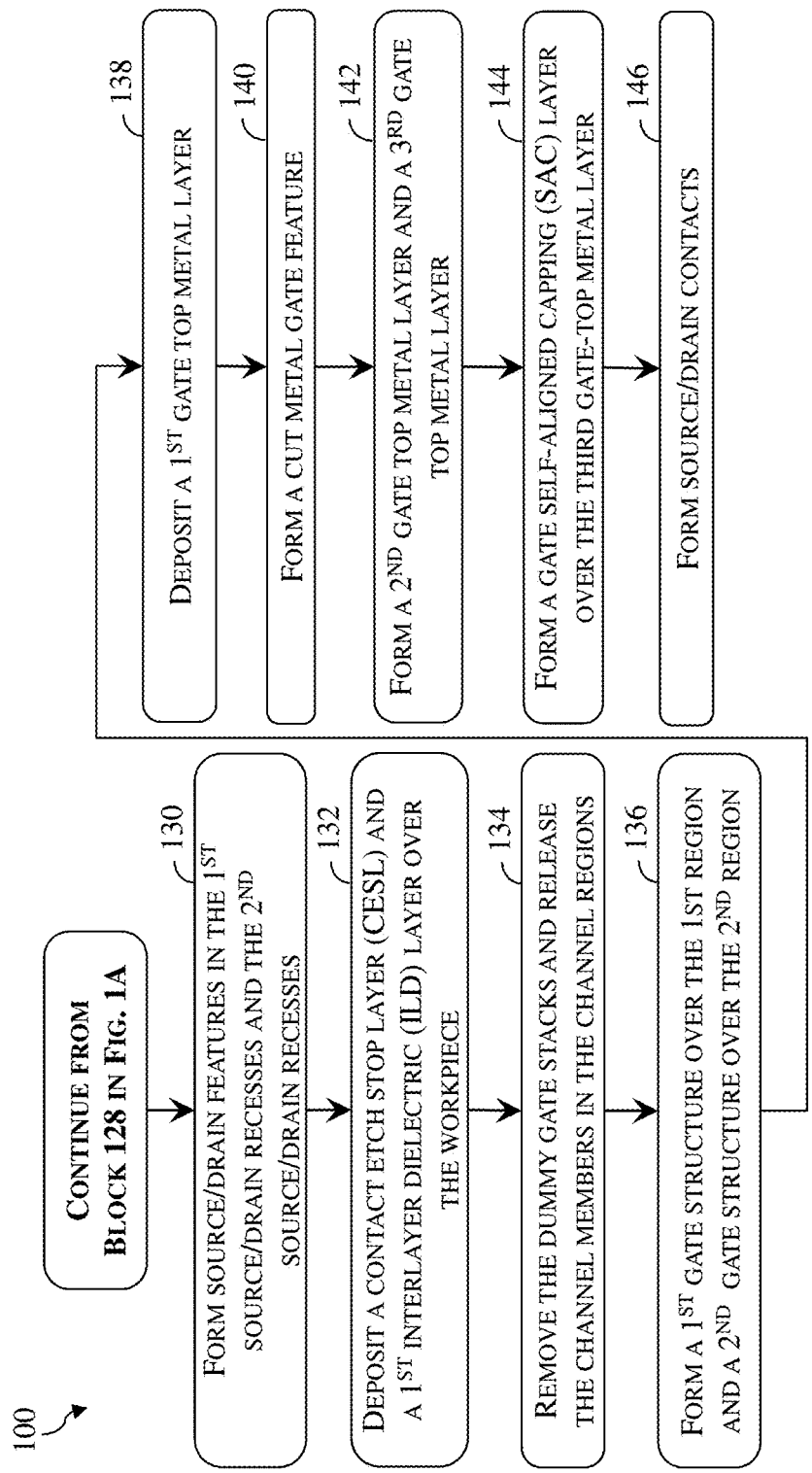

The various aspects of the present disclosure will now be described in more detail with reference to the figures. FIGS. 1A and 1B collectively illustrate a flowchart of a method 100 of forming a semiconductor device. Method 100 is merely an example and is not intended to limit the present disclosure to what is explicitly illustrated in method 100. Additional steps may be provided before, during and after method 100, and some steps described can be replaced, eliminated, or moved around for additional embodiments of the methods. Not all steps are described herein in detail for reasons of simplicity. Method 100 is described below in conjunction with FIGS. 2-30, which illustrate fragmentary cross-sectional views of a workpiece 200 at different stages of fabrication according to embodiments of method 100. Because a semiconductor device will be formed from the workpiece 200, the workpiece 200 may be referred to as a semiconductor device 200 or a semiconductor structure 200 as the context requires. Throughout FIGS. 2-30, the X direction, the Y direction, and the Z direction are perpendicular to one another and are used consistently. Additionally, throughout the present disclosure, like reference numerals are used to denote like features.

Referring to FIGS. 1A and 2, method 100 may optionally include a block 102 where a first anti-punch-through (APT) layer 204 is formed over a first region 202A of a substrate 202. As shown in FIG. 2, operations of method 100 is performed to a workpiece 200 that includes a substrate 202. In one embodiment, the substrate 202 may be a silicon (Si) substrate. In some other embodiments, the substrate 202 may include other semiconductor materials such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 202 may also include an insulating layer, such as a silicon oxide layer, to have a silicon-on-insulator (SOI) structure or a germanium-on-insulator (GeOI) structure. The substrate 202 includes a first region 202A and a second region 202B for formation of MBC transistors of different configurations.

At block 102, a first patterned mask 203 is formed over the workpiece 200 to cover the second region 202B and expose the first region 202A. The first patterned mask 203 serves as an ion implantation mask and may include a photoresist, a metal layer, a bottom antireflective coating (BARC) layer, or a carbon-containing layer. To form the first APT layer 204 over the first region 202A, a first ion implantation process 300 is performed to the workpiece 200 while the second region 202B is protected by the first patterned mask 203. The first ion implantation process 300 is configured to form the first APT layer 204 near a top surface of the first region 202A. In some embodiments, the first ion implantation process 300 includes a first ion energy between about 2 KeV and about 100 KeV, a first ion dose between about $1\times10^{13}$ ion/cm$^2$ and about $1\times10^{15}$ ions/cm$^2$, and a first temperature between about 600° C. and about 1100° C. A thickness of the first APT layer 204 is defined by a depth region with a minimum activation concentration of $1\times10^{18}$ ions/cm$^3$ or more. In some instances, the thickness of the first APT layer 204 is between about 10 nm and about 30 nm and may be detected using Energy-dispersive X-ray spectroscopy (EDS, EDX, EDXS or XEDS). Depending on the conductivity type of the MBC transistor to be fabricated over the first region 202A and the second region 202B, the first ion implantation process 300 may implant different dopant species and the first APT layer 204 may include different dopant species. For example, when the to-be-fabricated MBC transistors are n-type, the first APT layer 204 include a p-type dopant, such as boron (B) or boron difluoride (BF$_2$). When the to-be-fabricated MBC transistors are p-type, the first APT layer 204 include an n-type dopant, such as phosphorus (P) or arsenic (As). After the first ion implantation process 300, the first patterned mask 203 is removed by ashing or selective etching.

Figure 3:
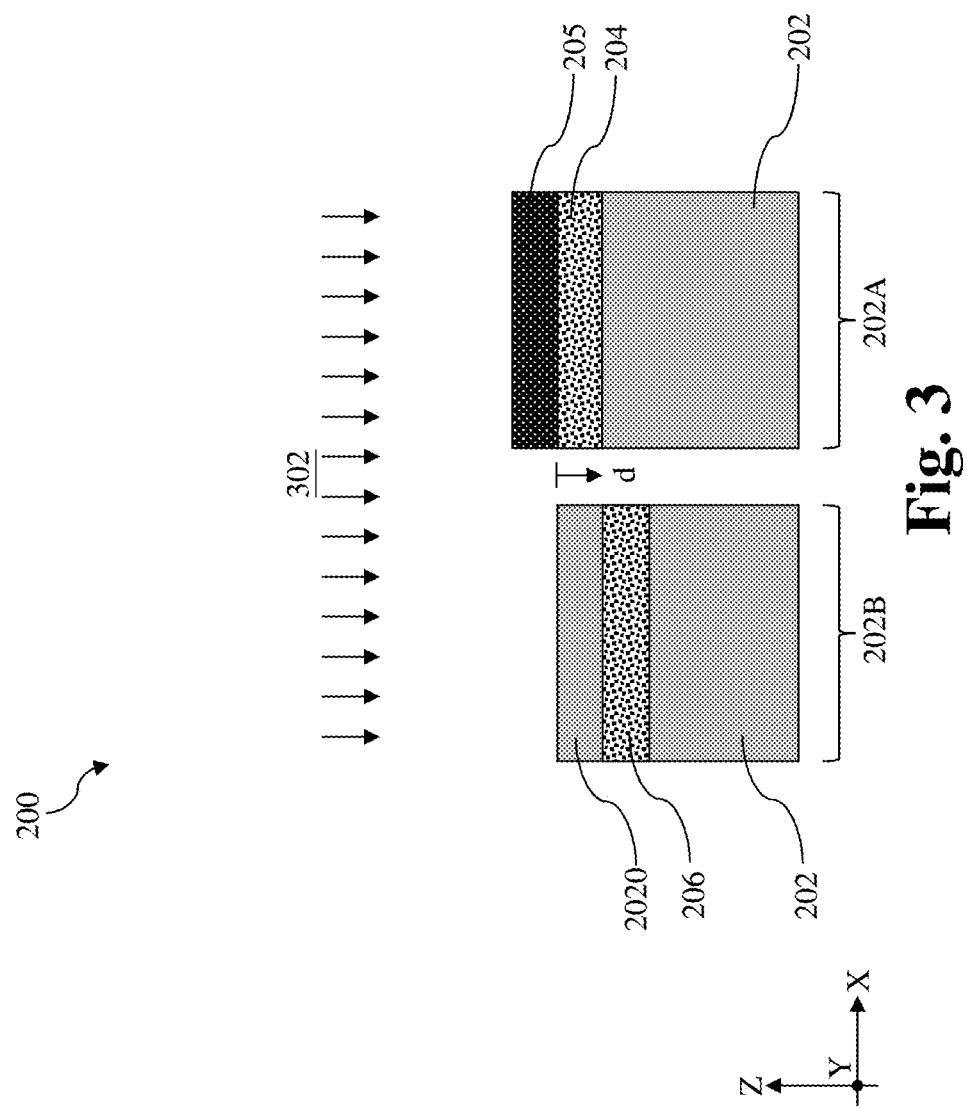

Referring to FIGS. 1A and 3, method 100 may optionally include a block 104 where a second anti-punch-through (APT) layer 206 is formed in a second region 202B of a substrate 202. To selectively form the second APT layer 206 in the second region 202B, a second patterned mask 205 is formed over the workpiece 200 to cover the first region 202A and expose the second region 202B. Like the first patterned mask 203, the second patterned mask 205 serves as an ion implantation mask and may include a photoresist, a metal layer, or a carbon-containing layer. A second ion implantation process 302 is then performed to the workpiece 200 while the first region 202A is protected by the second patterned mask 205. The second ion implantation process 302 is configured to form the second APT layer 206 at a depth d from a top surface of the second region 202B. In some embodiments, the second ion implantation process 302 includes a second ion energy between about 5 KeV and about 150 KeV, a second ion dose between about $1\times10^{13}$ ion/cm$^2$ and about $1\times10^{15}$ ions/cm$^2$, and a second temperature between about 600° C. and about 1100° C. The second ion energy is greater than the first ion energy and the second ion dose is greater than the first ion dose. A thickness of the second APT layer 206 is defined by a depth region with a minimum activation concentration of $1\times10^{18}$ ions/cm$^3$ or more. In some instances, the thickness of the second APT layer 206 is between about 10 nm and about 30 nm and may be detected using Energy-dispersive X-ray spectroscopy (EDS, EDX, EDXS or XEDS). Depending on the conductivity type of the MBC transistor to be fabricated over the first region 202A and the second region 202B, the second ion implantation process 302 may implant different dopant species and the second APT layer 206 may include different dopant species. For example, when the to-be-fabricated MBC transistors are n-type, the second APT layer 206 include a p-type dopant, such as boron (B) or boron difluoride (BF$_2$). When the to-be-fabricated MBC transistors are p-type, the second APT layer 206 include an n-type dopant, such as phosphorus (P) or arsenic (As). After the first ion implantation process 300, the first patterned mask 203 is removed by ashing or selective etching. As shown in FIG. 3, with the second APT layer 206 at the depth d, the portion of the substrate 202 over the second APT layer 206 in the second region 202B may be identified as a cover layer 202O. The cover layer 202O contains the same dopant species in the second APT layer 206 but the dopant concentration in the cover layer 202O is below $1\times10^{18}$ ions/cm$^3$.

Figure 4:
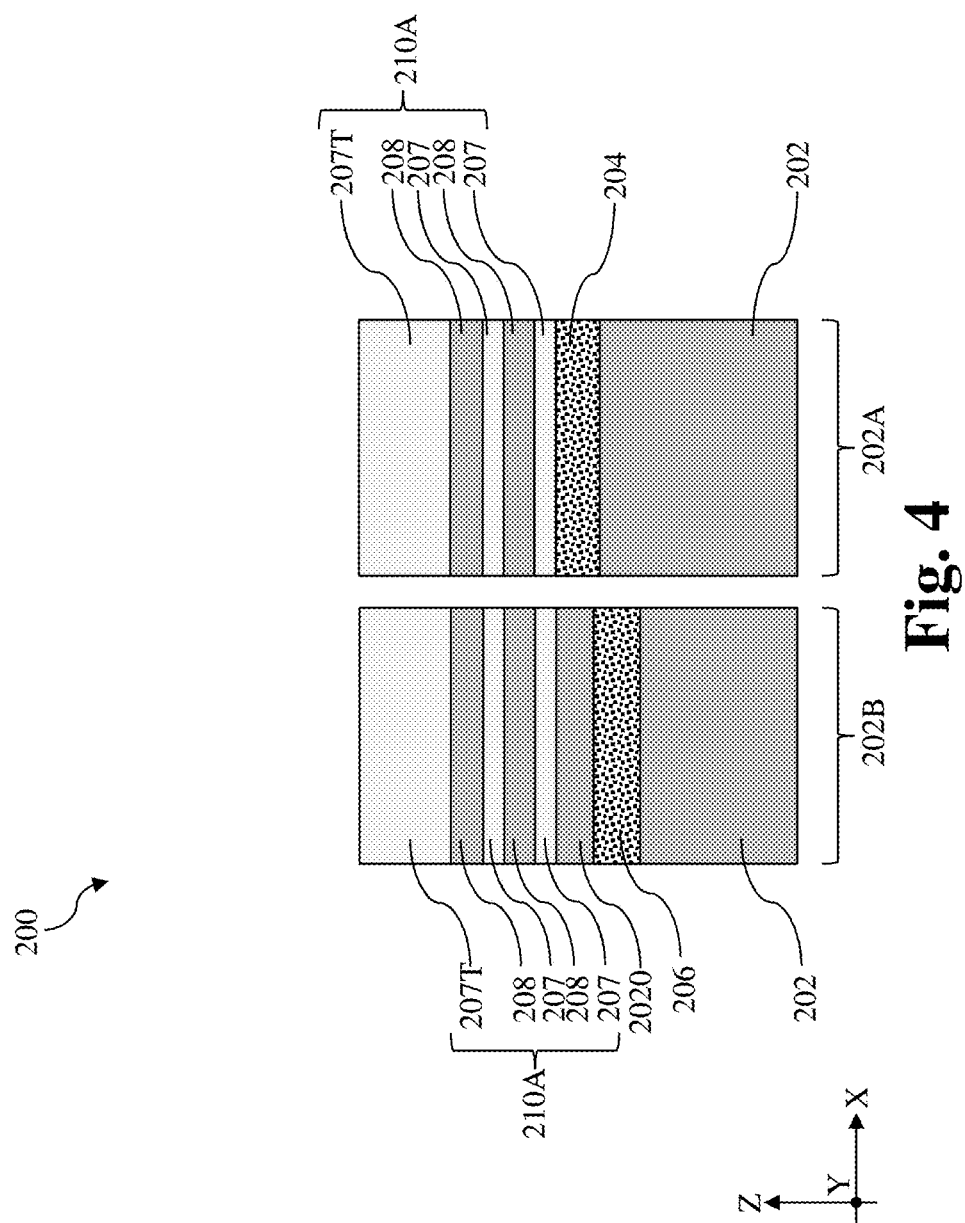

Referring to FIGS. 1A and 4, method 100 includes a block 106 wherein a first stack 210A is formed over the first region 202A and the second region 202B of a substrate 202. The first stack 210A include a first number (N1) of channel layers 208 interleaved by sacrificial layers 207. In the depicted embodiment, the first stack 210A includes two (2) channel layers interleaved by two (2) sacrificial layers and one top sacrificial layer 207T. The top sacrificial layer 207T is thicker than the other sacrificial layers 207 to protect underlying channel layers 208 in subsequent process steps. In some implementations, the channel layers 208 are formed of silicon (Si) and the sacrificial layers 207 (including the top sacrificial layer 207T) are formed of silicon germanium (SiGe). In these implementations, the additional germanium content in the sacrificial layers 207 (or the top sacrificial layer 207T) allow selective removal or recess of the sacrificial layers 207 without substantial damages to the first number of channel layers 208. The sacrificial layers 207, the top sacrificial layer 207T, and the first number of channel layers 208 may be deposited using an epitaxial process. In some embodiments, the first stack 210A may be epitaxially deposited using CVD deposition techniques (e.g., vapor-phase epitaxy (VPE) and/or ultra-high vacuum CVD (UHV-CVD), molecular beam epitaxy (MBE), and/or other suitable processes. The sacrificial layers 207 (or the top sacrificial layer 207T) and the channel layers 208 are deposited alternatingly, one-after-another, to form the first stack 210A. It is noted that two (2) layers of the sacrificial layers 207 and two (2) layers of the channel layers 208 are alternately and vertically arranged as illustrated in FIG. 4, which is for illustrative purposes only and not intended to be limiting beyond what is specifically recited in the claims. The first number (N1) of channel layers 208 may be between 2 and 7. Referring to FIG. 4, the first stack 210A is deposited directly on the first APT layer 204 over the first region 202A and directly on the cover layer 202O over the second region 202B.

Figure 5:
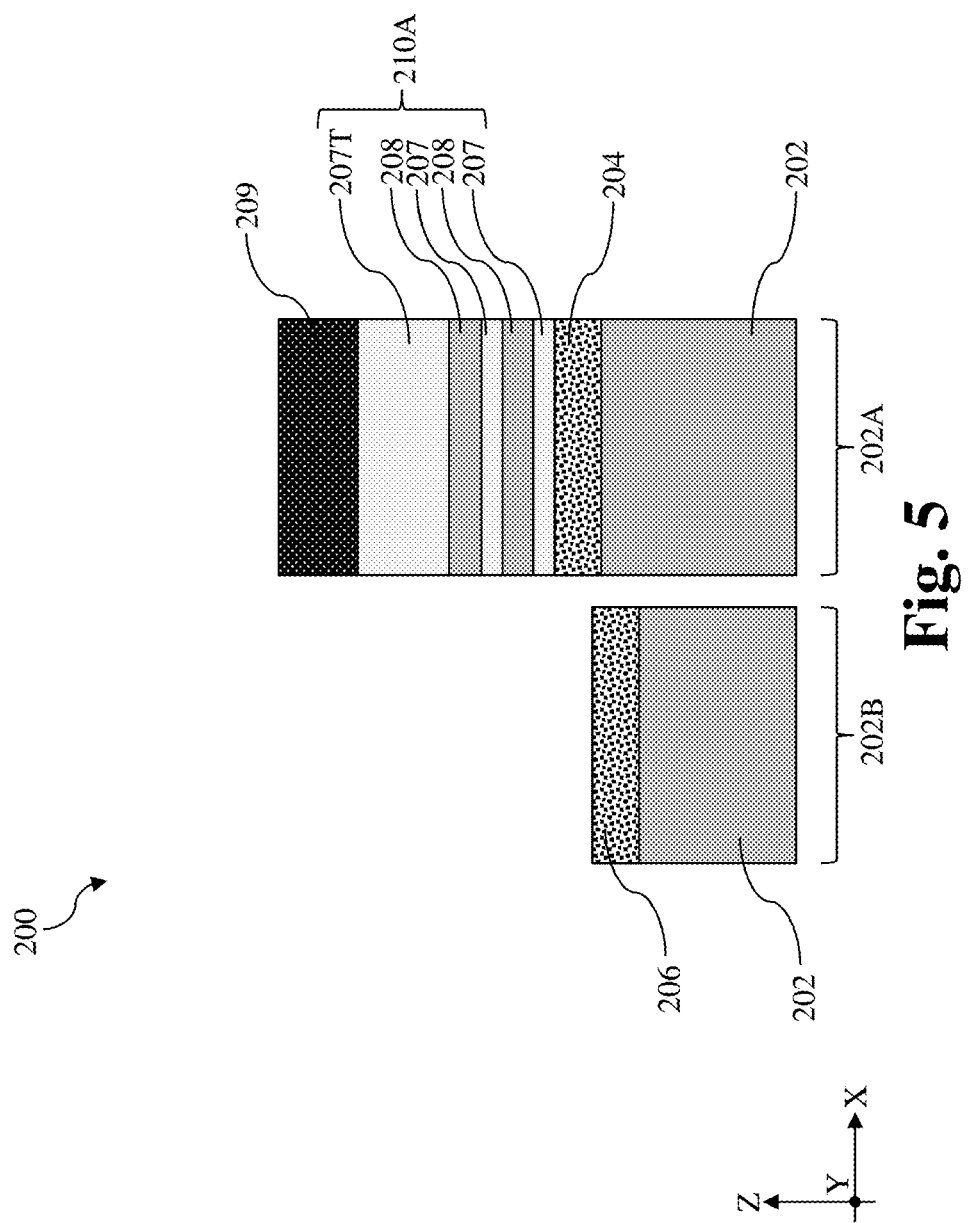

Referring to FIGS. 1A and 5, method 100 includes a block 108 wherein the first stack 210A over the second region 202B is selectively removed. In some embodiments represented in FIG. 5, a third patterned mask 209 is formed over the workpiece 200 to cover the first stack 210A over the first region 202A and expose the first stack 210A over the second region 202B. The third patterned mask 209 may be a patterned photoresist layer, a patterned BARC layer, a silicon oxide layer, a silicon nitride layer, or a combination thereof. With the third patterned mask 209 in place, the workpiece 200 undergoes a dry etch process that implements hydrogen, a fluorine-containing gas (e.g., $CF_4$, $SF_6$, $CH_2F_2$, $NF_3$, $BF_3$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. In embodiments represented in FIG. 5, the dry etch process at block 108 not only removes the first stack 210A in the second region 202B but also removes the cover layer 202O, thereby exposing the second APT layer 206.

Figure 6:
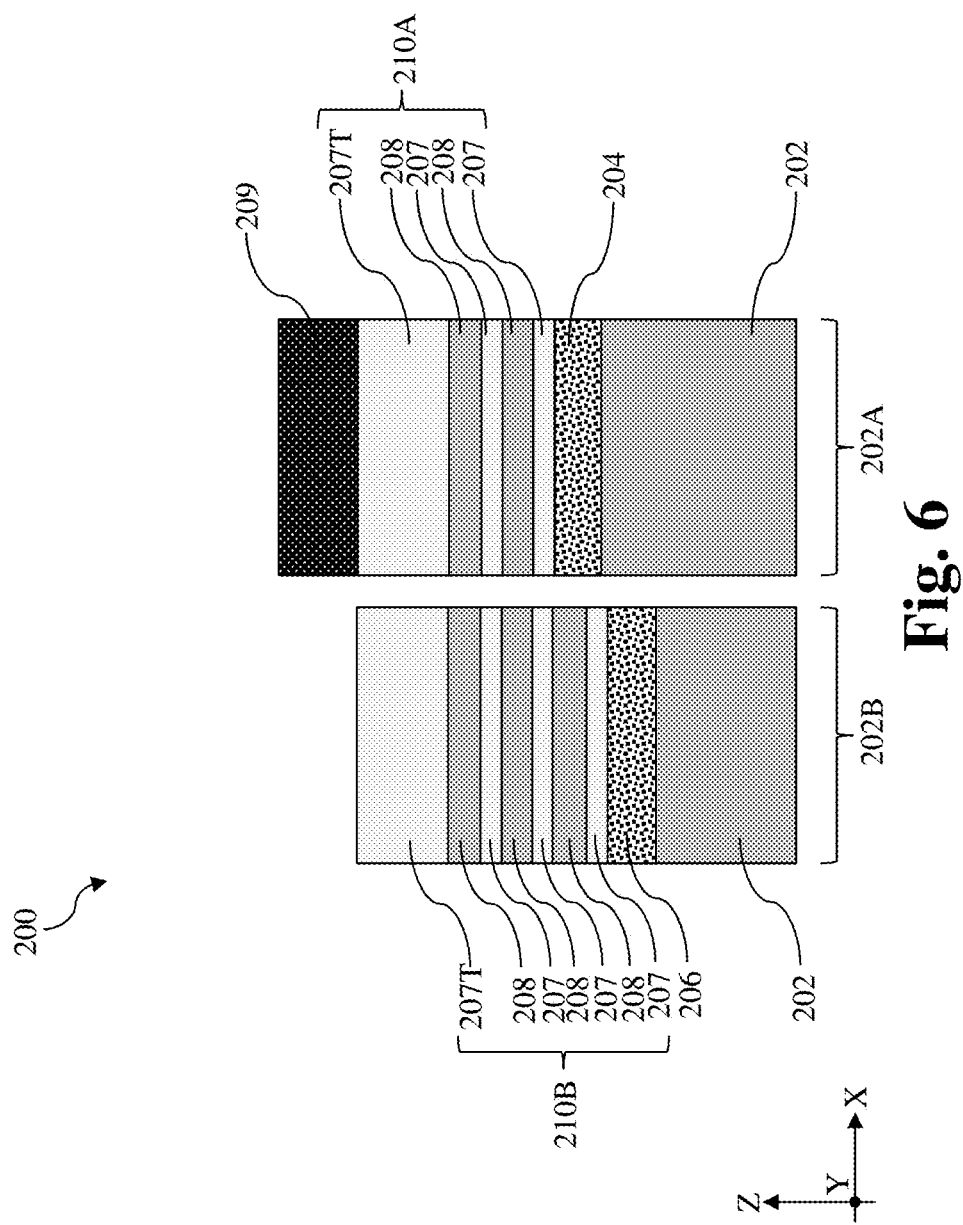

Referring to FIGS. 1A and 6, method 100 includes a block 110 wherein a second stack 210B is formed over the second region 202B. With the third patterned mask 209 still in place, the second stack 210B is deposited on the second APT layer 206 over the second region 202B. The second stack 210B include a second number (N2) of channel layers 208 interleaved by sacrificial layers 207. In the depicted embodiment, the second stack 210B includes three (3) channel layers interleaved by three (3) sacrificial layers and one top sacrificial layer 207T. The top sacrificial layer 207T is thicker than the other sacrificial layers 207 in the second stack 210B to protect underlying channel layers 208 in subsequent process steps. In some implementations, the channel layers 208 are formed of silicon (Si) and the sacrificial layers 207 (including the top sacrificial layer 207T) are formed of silicon germanium (SiGe). In these implementations, the additional germanium content in the sacrificial layers 207 (or the top sacrificial layer 207T) allow selective removal or recess of the sacrificial layers 207 without substantial damages to the second number of channel layers 208. The sacrificial layers 207, the top sacrificial layer 207T, and the second number of channel layers 208 may be deposited using an epitaxial process. In some embodiments, the second stack 210B may be epitaxially deposited using CVD deposition techniques (e.g., vapor-phase epitaxy (VPE) and/or ultra-high vacuum CVD (UHV-CVD), molecular beam epitaxy (MBE), and/or other suitable processes. Due to the epitaxial nature, layers in the second stack 210B may not be deposited on the third patterned mask 209. The sacrificial layers 207 (or the top sacrificial layer 207T) and the channel layers 208 are deposited alternatingly, one-after-another, to form the second stack 210B. It is noted that three (3) layers of the sacrificial layers 207, three (3) layers of the channel layers 208 and the top sacrificial layer 207T are alternately and vertically arranged as illustrated in FIG. 6, which is for illustrative purposes only and not intended to be limiting beyond what is specifically recited in the claims. The second number (N2) is greater than the first number (N1). In some embodiments, the second stack 210B includes one additional channel layer 208 than the first stack 210A. The second number (N2) of channel layers 208 may be between 1 and 6. Referring to FIG. 6, the second stack 210B is deposited directly on the second APT layer 206 over the second region 202B. After the deposition of the second stack 210B, the third patterned mask 209 is removed by ashing or selective etching.

Figure 7:
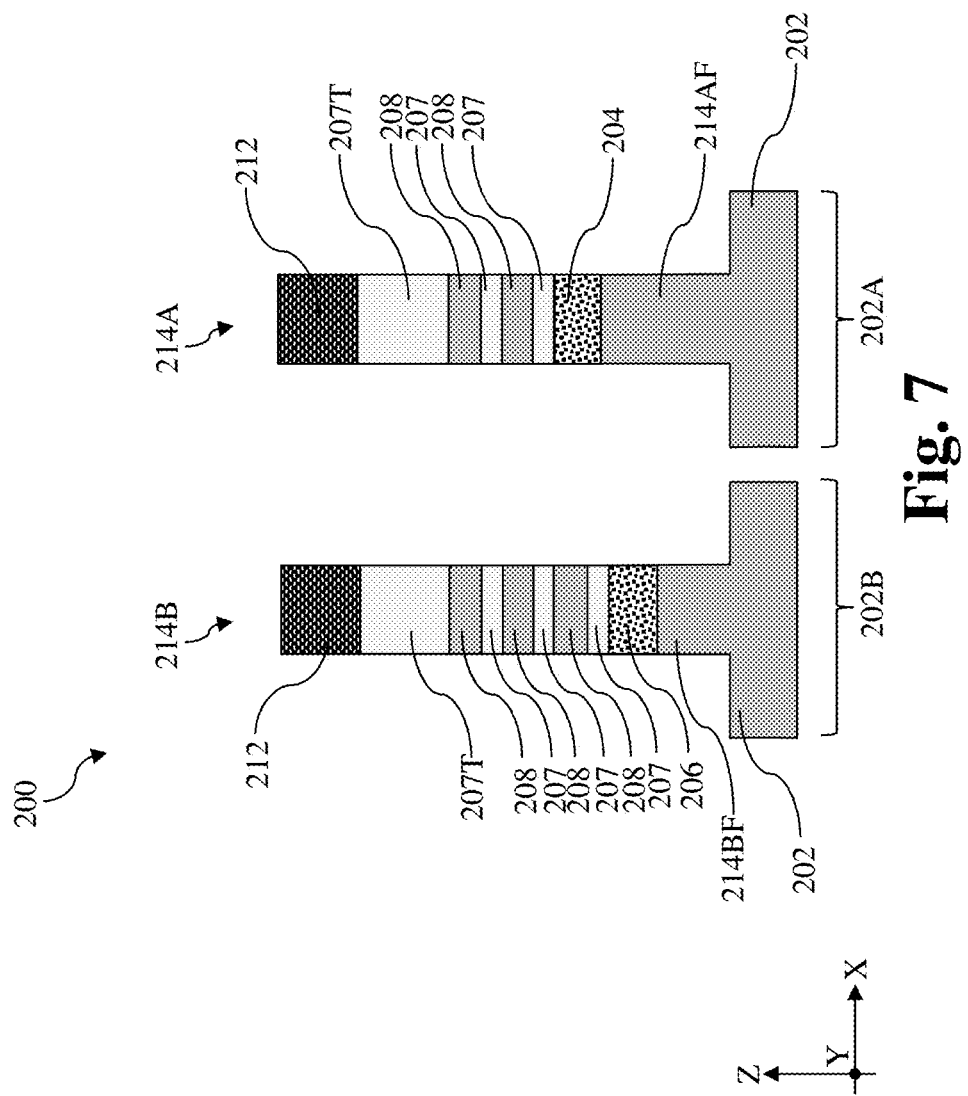

Referring to FIGS. 1A and 7, method 100 includes a block 112 where the first stack 210A and the second stack 210B are patterned to form a first fin-shaped structure 214A over the first region 202A and a second fin-shaped structure 214B over the second region 202B. To pattern the first stack 210A and the second stack 210B and a portion of the substrate 202, a fourth patterned mask 212 is formed over the workpiece 200. The workpiece 200 is then etched using the fourth patterned mask 212 as an etch mask to form the first fin-shaped structure 214A over the first region 202A and the second fin-shaped structure 214B over the second region 202B. The fourth patterned mask 212 may be a single layer or a multilayer. When the fourth patterned mask 212 is a multi-layer, the fourth patterned mask 212 includes a first layer and a second layer disposed over the first layer. In one embodiment, the first layer may be a pad oxide and the second layer may be a pad nitride layer. As shown in FIG. 7, the first fin-shaped structure 214A includes a first fin structure 214AF, the first APT layer 204, and layers in the first stack 210A and the second fin-shaped structure 214B includes a second fin structure 214BF, the second APT layer 206, and layers in the second stack 210B. The first fin structure 214AF is formed from the substrate 202 in the first region 202A and may also be referred to as a first base portion 214AF. The second fin structure 214BF is formed from the substrate 202 in the second region 202B and may also be referred to as a second base portion 214BF. Because the patterning at block 112 removes a substantial portion of the first APT layer 204 or the second APT layer 206, the first APT layer 204 in the first fin-shaped structure 214A and the second APT layer 206 in the second fin-shaped structure 214B may also be referred to as a first APT feature 204 and a second APT feature 206, respectively. The top sacrificial layers 207T in the first fin-shaped structure 214A and the second fin-shaped structure 214B have the same thickness and are not identified using different reference numerals.

Referring to FIG. 7, the first fin-shaped structure 214A and the second fin-shaped structure 214B extend lengthwise along the Y direction and extend vertically along the Z direction from the substrate 202. The first fin-shaped structure 214A and the second fin-shaped structure 214B may be patterned using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the fourth patterned mask 212. The first stack 210A, the second stack 210B and the substrate 202 are then etched using the fourth patterned mask 212 as an etch mask to form the first fin-shaped structure 214A and the second fin-shaped structure 214B. The etching process can include dry etching, wet etching, reactive ion etching (RIE), and/or other suitable processes. The dry etching process to form the first fin-shaped structure 214A and the second fin-shaped structure 214B may include use of hydrogen, a fluorine-containing gas (e.g., $CF_4$, $SF_6$, $CH_2F_2$, $NF_3$, $BF_3$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof.

Figure 8:
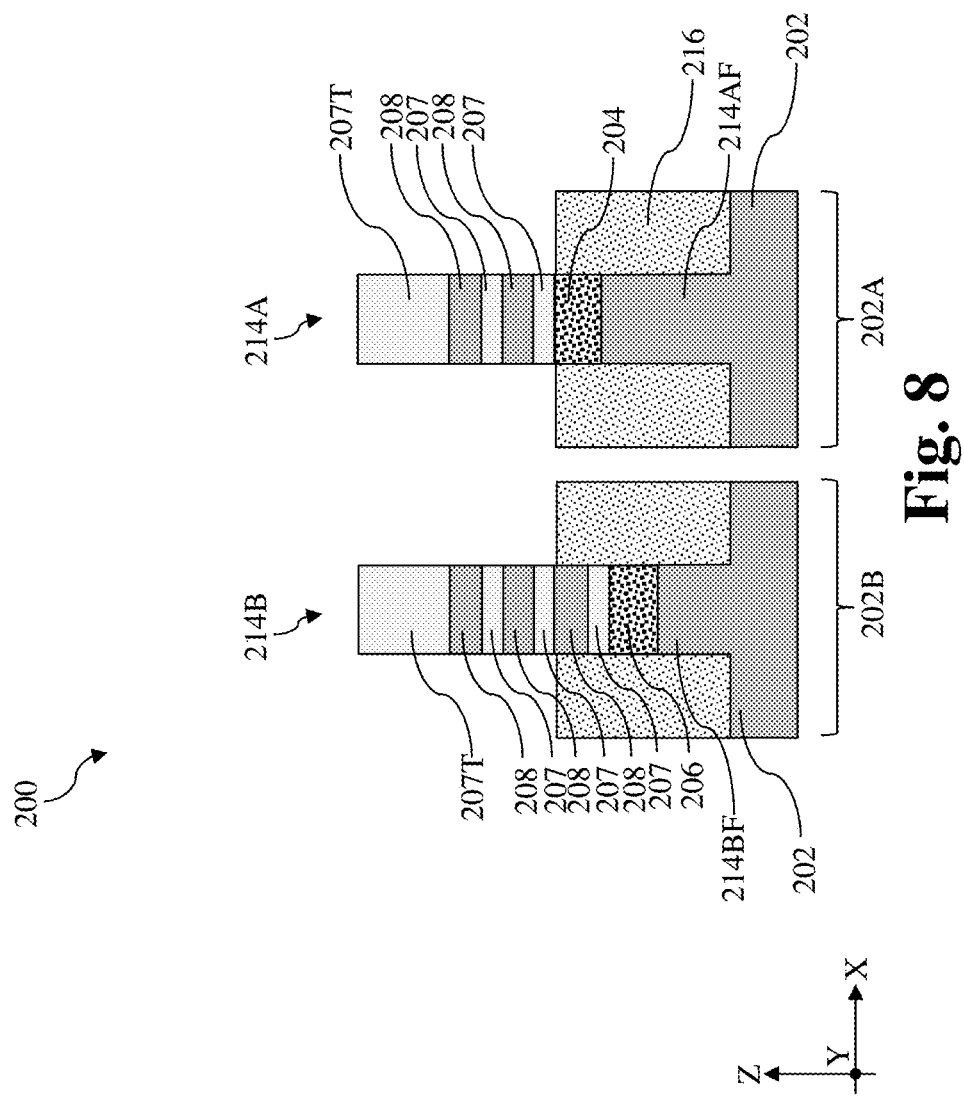

Referring to FIGS. 1A and 8, method 100 includes a block 114 where an isolation feature 216 is formed. After the first fin-shaped structure 214A and the second fin-shaped structure 214B are formed, the isolation feature 216 shown in FIG. 8 is formed between neighboring first fin-shaped structures 214A or neighboring second fin-shaped structures 214B (shown, for example, in FIGS. 10-36). The isolation feature 216 may also be referred to as a shallow trench isolation (STI) feature 216. In an example process, a dielectric material for the isolation feature 216 is first deposited over the workpiece 200, filling the trenches between neighboring first fin-shaped structures 214A or neighboring second fin-shaped structures 214B with the dielectric material. In some embodiments, the dielectric material may include silicon oxide, silicon nitride, silicon oxynitride, fluorine-doped silicate glass (FSG), a low-k dielectric, combinations thereof, and/or other suitable materials. In various examples, the dielectric material may be deposited by a CVD process, a subatmospheric CVD (SACVD) process, a flowable CVD (FCVD) process, an ALD process, spin-on coating, and/or other suitable process. The deposited dielectric material is then thinned and planarized, for example by a chemical mechanical polishing (CMP) process. The planarized dielectric material is further recessed by a dry etching process to form the isolation feature 216. As shown in FIG. 8, after the recess, the first fin-shaped structures 214A and the second fin-shaped structures 214B rise above the isolation feature 216 while the first base portion 214AF and the second base portion 214BF are surrounded by the isolation feature 216. The fourth patterned mask 212 is removed by the CMP process and/or the recess process.

Figure 9:
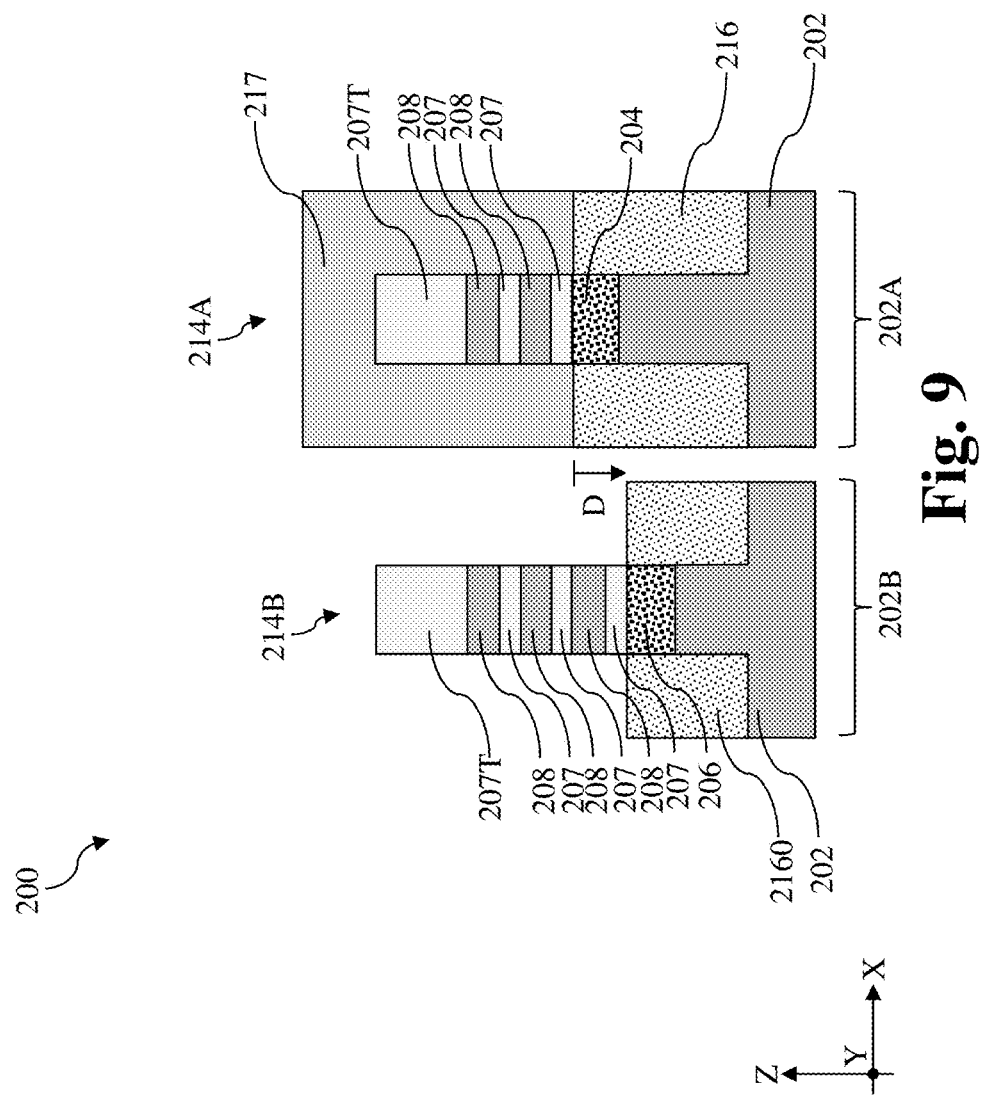

Referring to FIGS. 1A and 9, method 100 includes a block 116 where the isolation feature 216 in the second region 202B is selectively recessed to form a recessed isolation feature 2160 in the second region 202B. To selectively recess the isolation feature 216 in the second region 202B, a fifth patterned mask 217 is formed over the workpiece 200 to cover the first region 202A and expose the second region 202B. In some embodiments, the fifth patterned mask 217 may be a photoresist layer or a BARC layer. The selective recess at block 116 is selective to the composition of the isolation feature 216 and may include a fluorine-containing gas (e.g., $CF_4$, $SF_6$, $CH_2F_2$, $NF_3$, $BF_3$, $CHF_3$, and/or $C_2F_6$), a suitable gas species, or a combination thereof. In some embodiments, the selective recess at block 116 reduces the thickness of the isolation feature 216 in the second region 202B by a difference D. In some instances, the difference D may be between about 10 nm and about 30 nm. The difference D is a multiple of a sum of a thickness of the channel layer 208 and a thickness of the sacrificial layer 207. For example, when the difference between the first number (N1) and the second number (N2) is 1 in the depicted embodiment, the difference D is equal to the sum of the thickness of the channel layer 208 and the thickness of the sacrificial layer 207. When the difference between the first number (N1) and the second number (N2) is 2, the difference D is equal to twice the sum of the thickness of the channel layer 208 and the thickness of the sacrificial layer 207. After the selective recess at block 116, the recessed isolation feature 2160 is formed in the second region 202B while the isolation feature 216 in the first region 202A remains protected by the fifth patterned mask 217. After the formation of the recessed isolation feature 2160, the fifth patterned mask 217 is removed.

Figure 10:
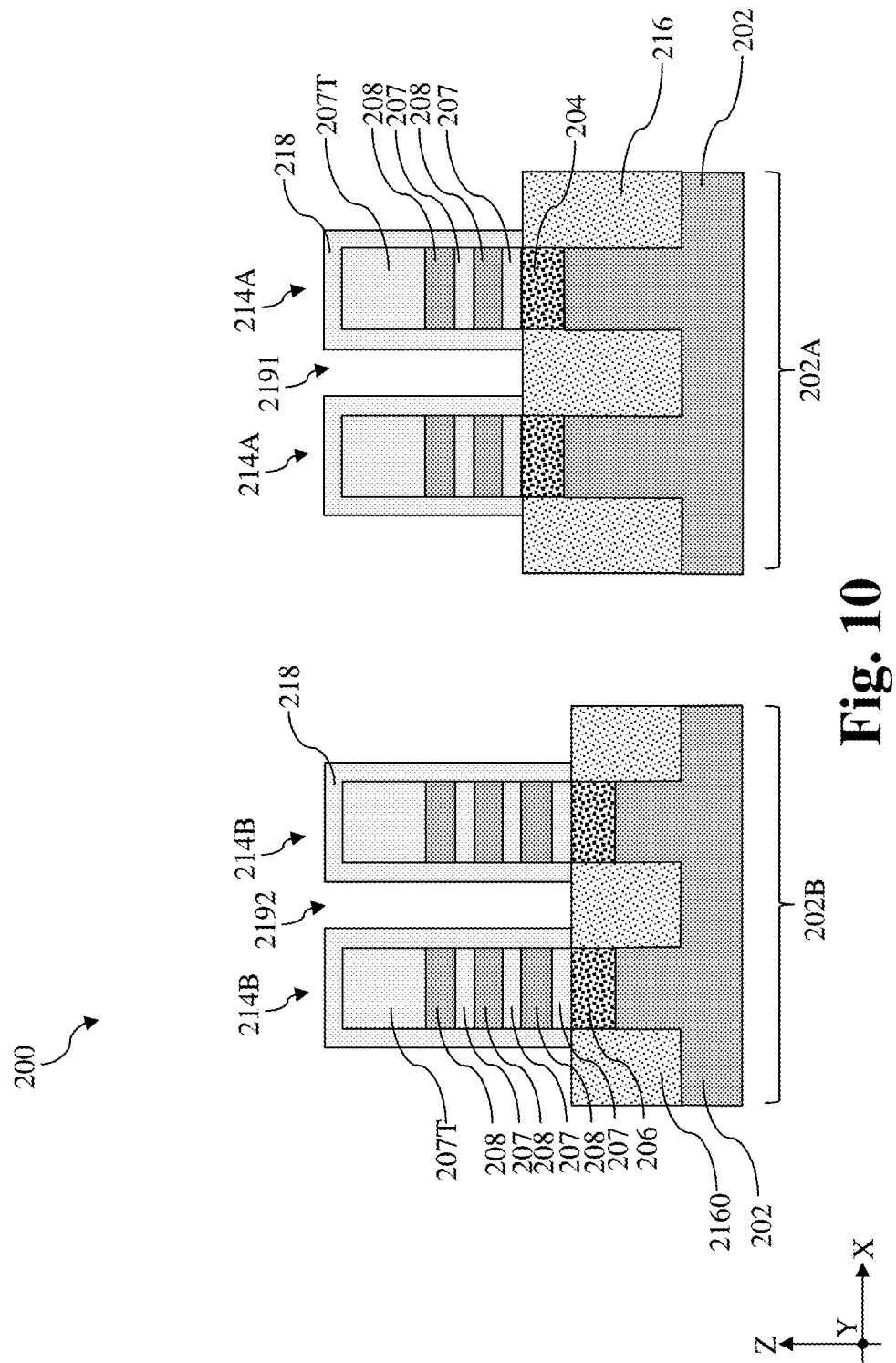

Referring to FIGS. 1A and 10, method 100 includes a block 118 where a cladding layer 218 is formed over the first fin-shaped structure 214A and the second fin-shaped structure 214B. In some embodiments, the cladding layer 218 may have a composition similar to that of the sacrificial layers 207. In one example, the cladding layer 218 may be formed of silicon germanium (SiGe). This common composition allows selective removal of the sacrificial layers 207 and the cladding layer 218 in a subsequent process. In some embodiments, the cladding layer 218 may be conformally and epitaxially grown using vapor phase epitaxy (VPE) or molecular beam epitaxy (MBE). As shown in FIG. 10, the cladding layer 218 is selectively disposed on exposed surfaces of the first fin-shaped structure 214A and the second fin-shaped structure 214B, but not on the surfaces of the isolation feature 216 or the recessed isolation feature 2160.

Figure 11:
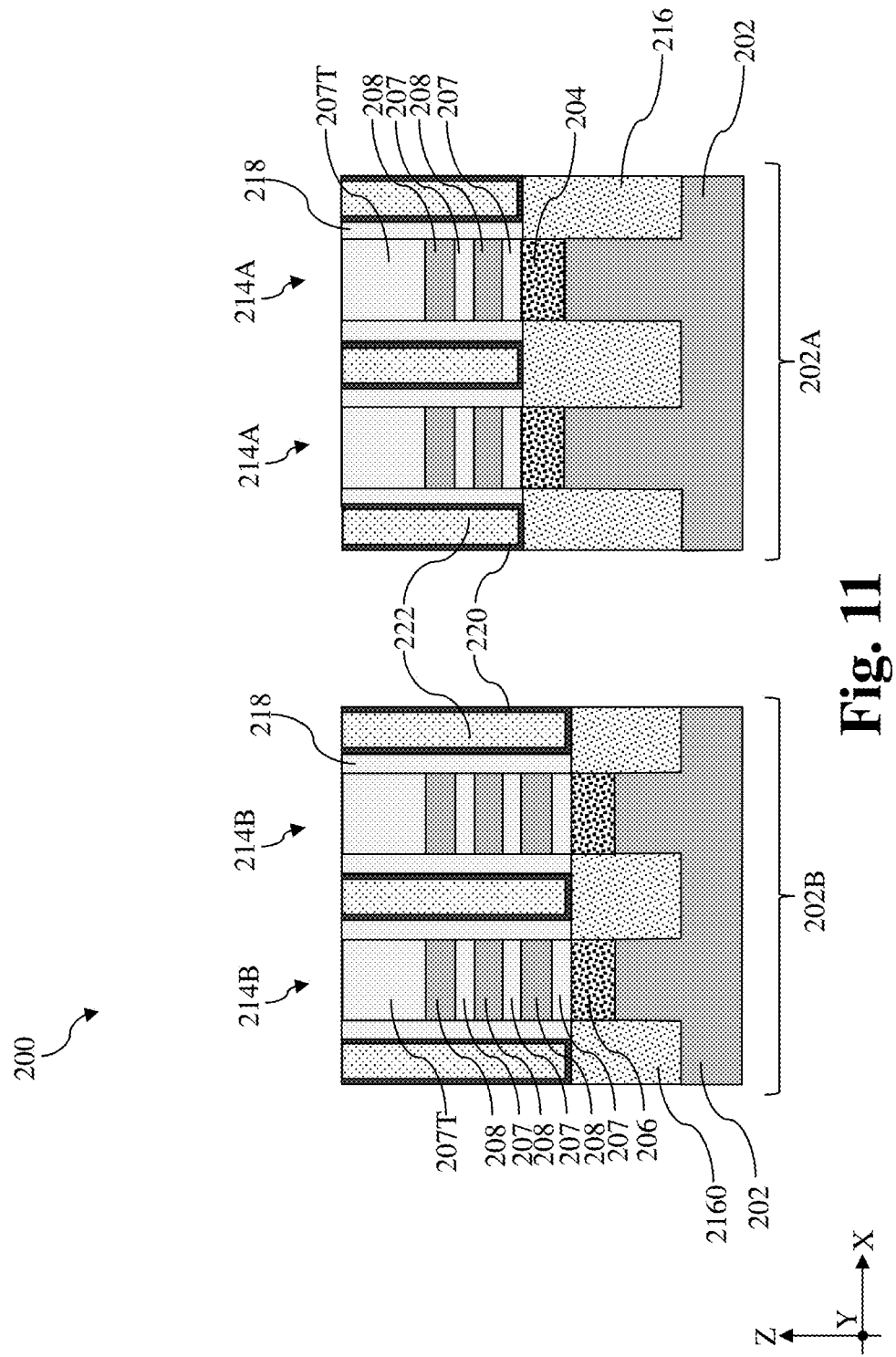
Figure 12:
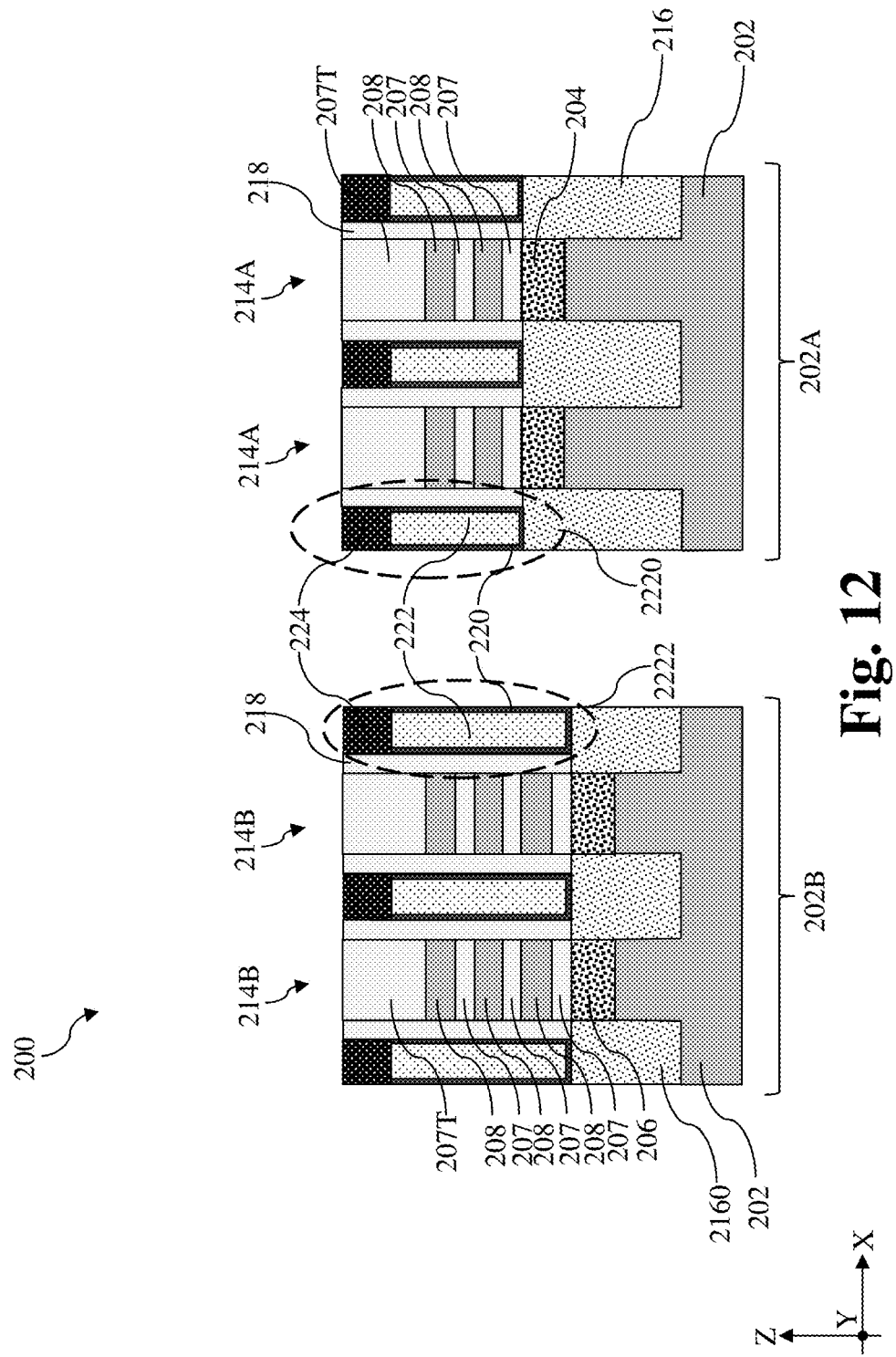

Referring to FIGS. 1A, 1 and 12, method 100 includes a block 120 where dielectric fins are formed. At block 112, first dielectric fins 2220 are formed in first trenches 2191 and second dielectric fins 2222 are formed in the second trenches 2192. In the depicted embodiments, each of the first dielectric fin 2220 and the second dielectric fin 2222 includes multiple layers. In an example process, a liner 220 is conformally deposited over the workpiece 200, including in the first trenches 2191 and the second trenches 2192, as shown in FIG. 11. The liner 220 may be deposited using PECVD, ALD, or a suitable method. The liner 220 lines the sidewalls and the bottom surfaces of the first trenches 2191 and the second trenches 2192. A filler layer 222 is then deposited over the liner 220 on the workpiece 200 using CVD, SACVD, FCVD, ALD, spin-on coating, and/or other suitable process. In some instances, a dielectric constant of the liner 220 is greater than that of the filler layer 222. The liner 220 may include silicon, silicon nitride, silicon carbide, silicon carbonitride, silicon oxycarbonitride, aluminum oxide, aluminum nitride, aluminum oxynitride, zirconium oxide, zirconium nitride, zirconium aluminum oxide, hafnium oxide, or a suitable dielectric material. The filler layer 222 may include silicon oxide, silicon carbide, silicon oxynitride, silicon oxycarbonitride, or a suitable dielectric material. After the deposition of the liner 220 and the filler layer 222, the workpiece 200 is planarized using a planarization process, such as a chemical mechanical polishing (CMP) process, until portion of the liner 220 and the filler layer 222 over the cladding layer 218 are removed, as shown in FIG. 11. Referring to FIG. 12, after the planarization, the filler layer 222 and the liner 220 are selectively and partially recessed to form a recess defined by adjacent cladding layer 218. A helmet layer 224 is then deposited over the workpiece 200. The helmet layer 224 may include silicon nitride, silicon carbide, silicon carbonitride, silicon oxycarbonitride, aluminum oxide, aluminum nitride, aluminum oxynitride, zirconium oxide, zirconium nitride, zirconium aluminum oxide, hafnium oxide, or a suitable dielectric material. The workpiece 200 is then planarized using a CMP process to remove excess helmet layer 224 on the cladding layer 218. At this point, the first dielectric fins 2220 and the second dielectric fins 2222 are substantially formed. Each of the first dielectric fins 2220 and the second dielectric fins 2222 includes a helmet layer 224 disposed over the liner 220 and the filler layer 222. In one embodiment, the liner 220 includes silicon nitride, the filler layer 222 includes silicon oxide, and the helmet layer 224 includes aluminum oxide, aluminum nitride, aluminum oxynitride, zirconium oxide, zirconium nitride, zirconium aluminum oxide, or hafnium oxide. Vertical heights of the first dielectric fins 2220 and the second dielectric fins 2222 are determined by the height of the isolation feature 216 or the recessed isolation feature 2160. Because the recessed isolation feature 2160 is lower than the isolation feature 216 by the difference D, a height of the second dielectric fin 2222 surpasses a height of the first dielectric fin 2220 by the difference D.

Figure 13:
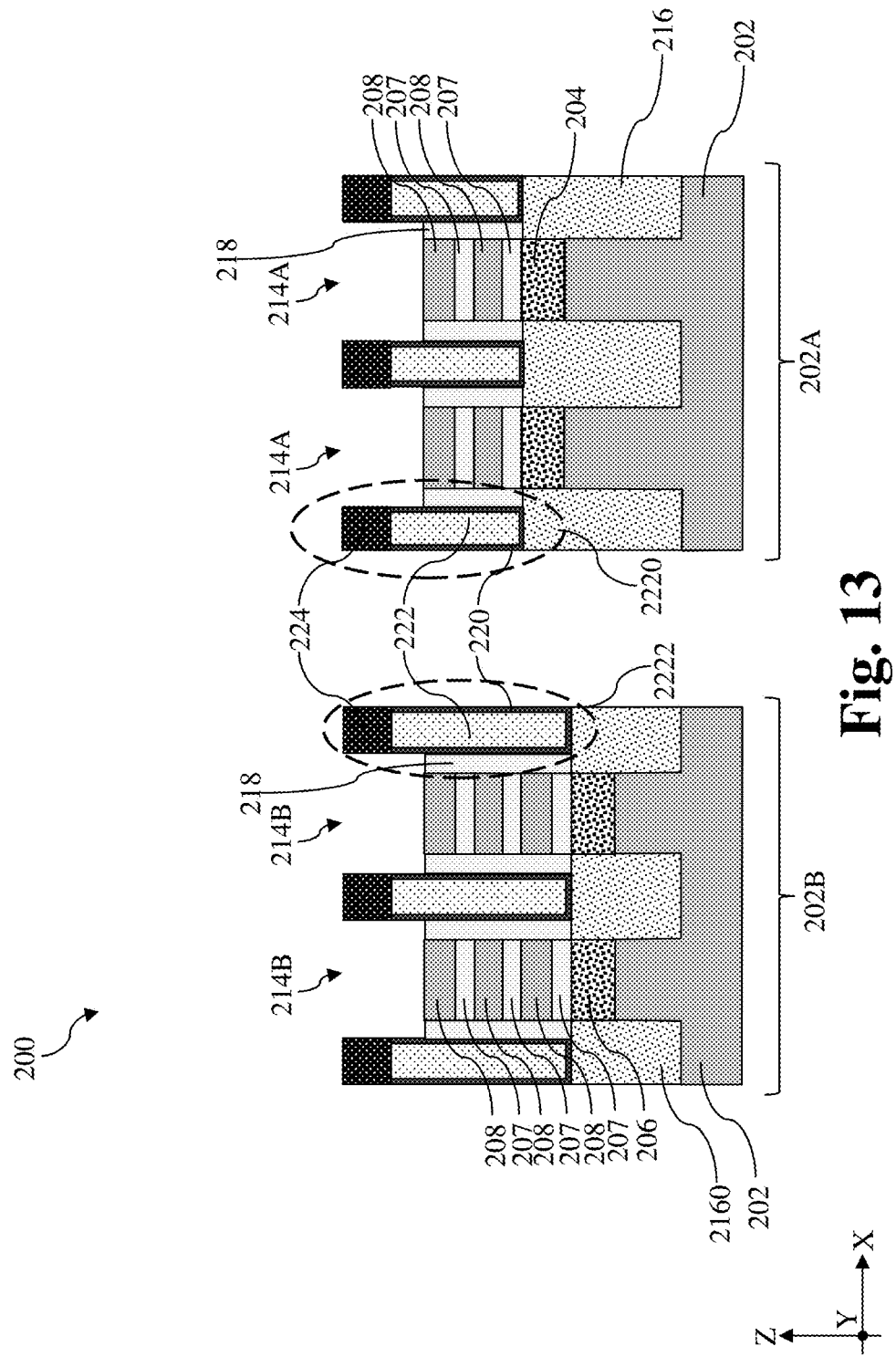

Referring to FIGS. 1A and 13, method 100 includes a block 122 where top sacrificial layers 207T over the first region 202A and the second region 202B are removed. As shown in FIG. 13, a portion of the cladding layer 218 is removed along with the top sacrificial layers 207T. Because the cladding layer 218 and the top sacrificial layers 207T are both formed of silicon germanium (SiGe), the removal of the top sacrificial layers 207T at block 122 may be performed using an etch process that is selective to silicon germanium. In one embodiment, the etch process at block 122 may include APM etch (e.g., ammonia hydroxide-hydrogen peroxide-water mixture). In another embodiment, the etch process at block 122 may include a selective dry etch process that may include use of one or more fluorine-based etchants, such as fluorine gas or hydrofluorocarbons. As shown in FIG. 13, the removal of the top sacrificial layers 207T expose the topmost channel layers 208 in the first region 202A and the second region 202B.

Figure 14:
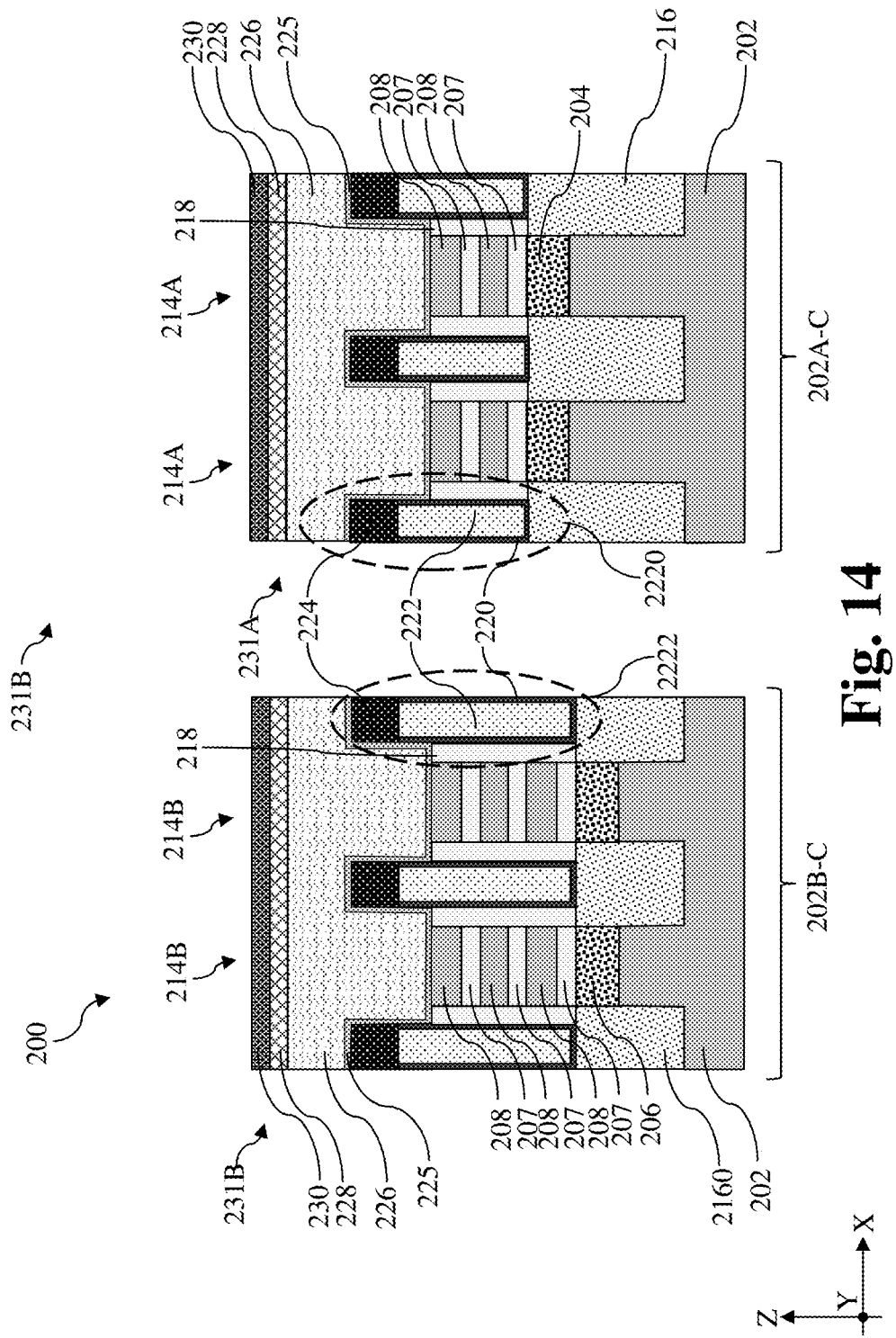

Referring to FIGS. 1A and 14, method 100 includes a block 124 where a first dummy gate stack 231A is formed over a channel region of the first fin-shaped structure 214A and a second dummy gate stack 231B is formed over a channel region of the second fin-shaped structures 214B. In some embodiments, a gate replacement process (or gate-last process) is adopted where the first dummy gate stack 231A and the second dummy gate stack 231B serves as placeholders for functional gate structures. Other processes and configuration are possible. It is noted that while the first dummy gate stack 231A and the second dummy gate stack 231B are separately labeled, they may the same dummy gate stack that spans from the first region 202A to the second region 202B. Each of the first dummy gate stack 231A and the second dummy gate stack 231B includes a dummy dielectric layer 225 on surfaces of the respective dielectric fins (first dielectric fins 2220 and second dielectric fins 2222) and exposed surfaces of the cladding layer 218 and the topmost channel layers 208 as well as a dummy electrode 226 disposed over the dummy dielectric layer 225. For patterning purposes, a silicon nitride mask layer 228 and a silicon oxide mask 230 layer over the silicon nitride mask layer 228 may be formed. The regions of the first fin-shaped structures 214A and the second fin-shaped structures 214B underlying the first dummy gate stack 231A and the second dummy gate stack 231B may be referred to as channel regions. For ease of reference, the channel region in the first region 202A is labeled as a first channel region 202A-C and the channel region in the second region 202B is labeled as a second channel region 202B-C. In an example process, the dummy dielectric layer 225 is blanketly deposited over the workpiece 200 by CVD. A material layer for the dummy electrode 226 is then blanketly deposited over the dummy dielectric layer 225. The dummy dielectric layer 225 and the material layer for the dummy electrode 226 are then patterned using photolithography processes to form the first dummy gate stack 231A and the second dummy gate stack 231B. In some embodiments, the dummy dielectric layer 225 may include silicon oxide and the dummy electrode 226 may include polycrystalline silicon (polysilicon).

Figure 25:
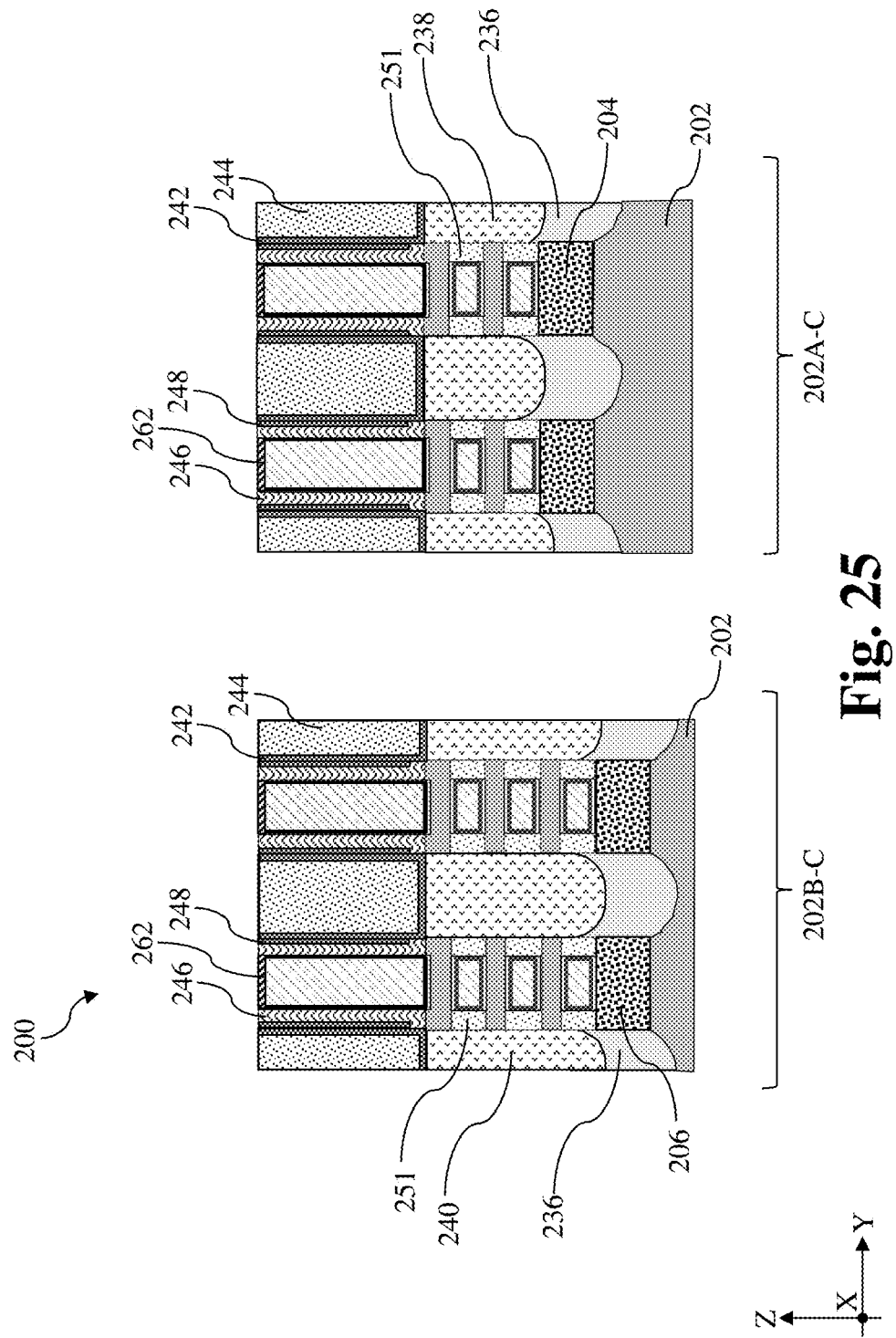

While not explicitly shown in FIG. 14, block 124 also includes operations to deposit a first gate spacer 246 and a second gate spacer 248 (shown in FIG. 25). The first gate spacer 246 and the second gate spacer 248 are formed of dielectric materials to allow selective removal of the first dummy gate stack 231A and the second dummy gate stack 231B. Suitable dielectric materials for the first gate spacer 246 and the second gate spacer 248 may include silicon nitride, silicon oxycarbonitride, silicon carbonitride, silicon oxide, silicon oxycarbide, silicon carbide, silicon oxynitride, and/or combinations thereof. In an example process, the first gate spacer 246 and the second gate spacer 248 may be conformally deposited over the workpiece 200 using CVD, subatmospheric CVD (SACVD), or ALD.

Figure 15:
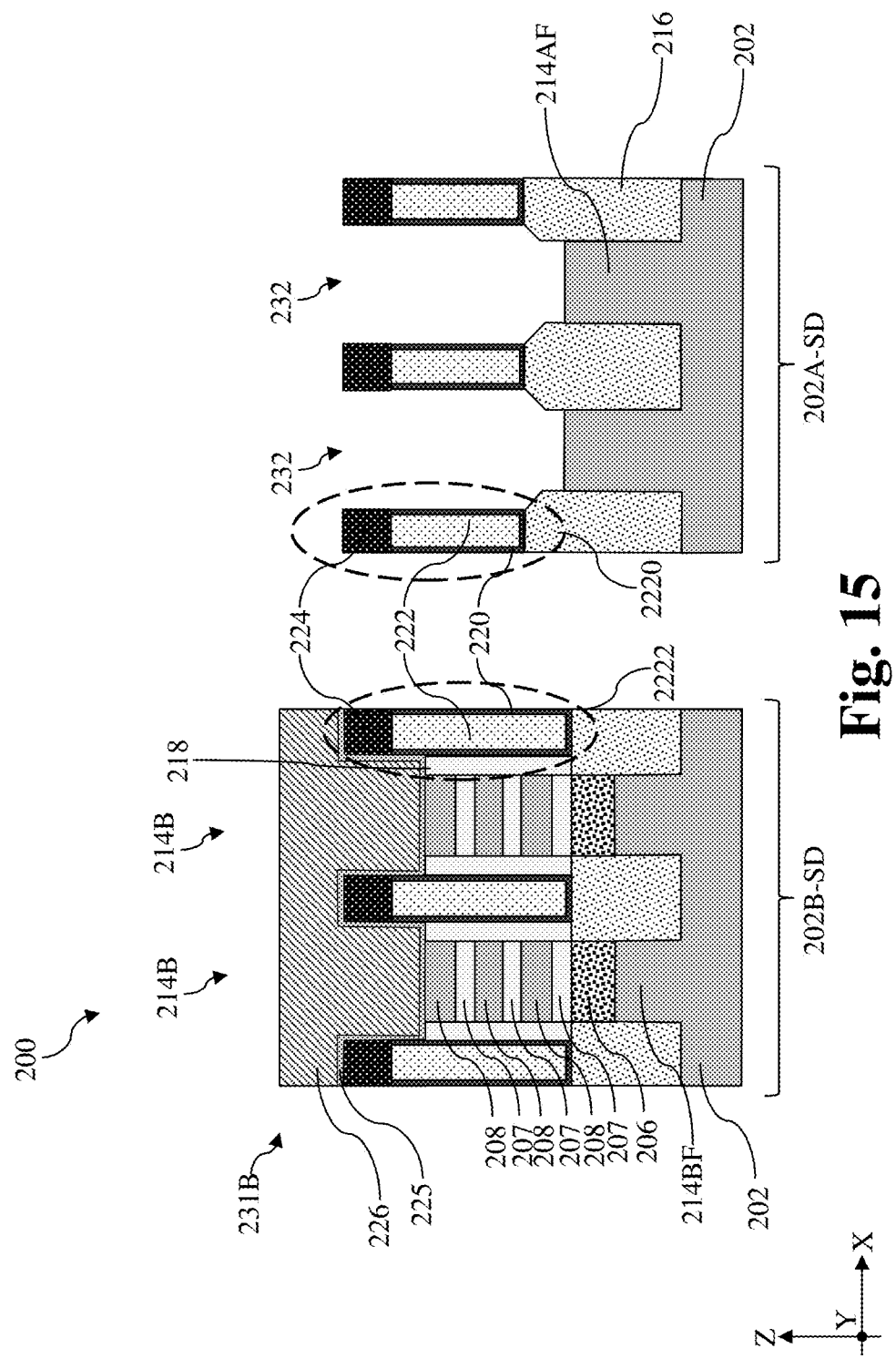
Figure 16:
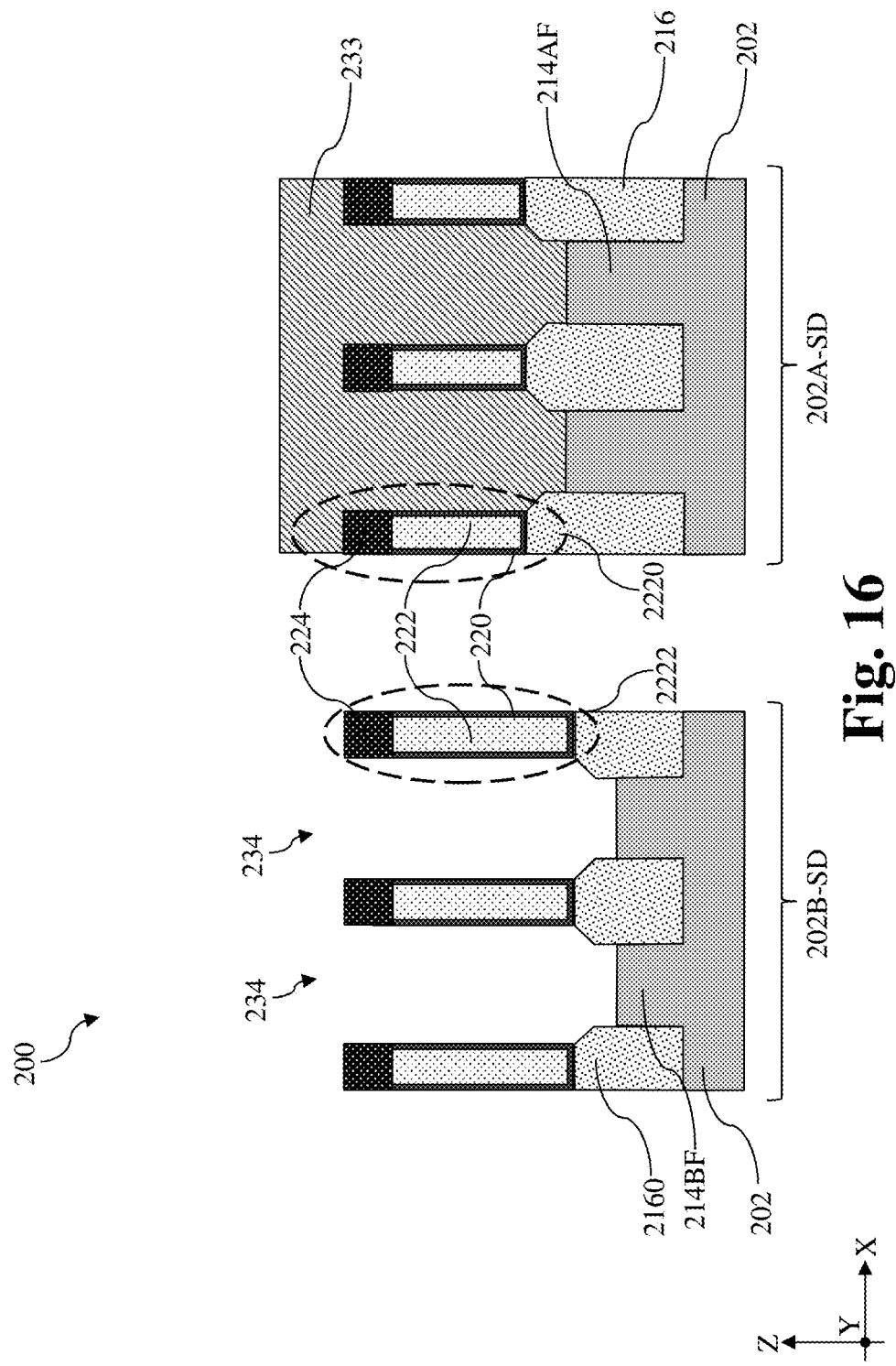
Figure 26:
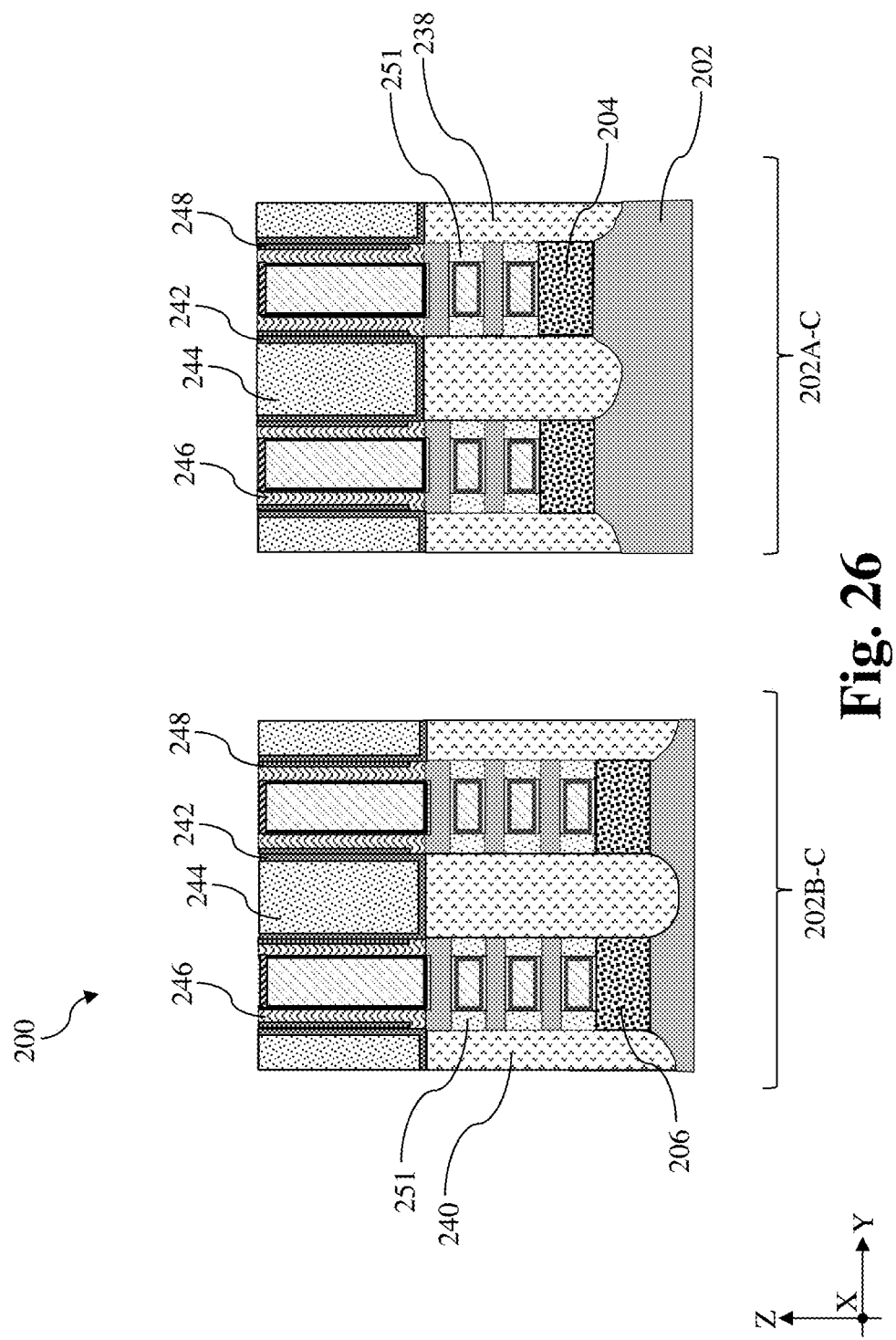

Referring to FIGS. 1A, 15 and 16, method 100 includes a block 126 where a first source/drain region 202A-SD of the first fin-shaped structures 214A is recessed to form first source/drain recesses 232 and a second source/drain region 202B-SD of the second fin-shaped structures 214B is recessed to form second source/drain recesses 234. The first source/drain recesses 232 and the second source/drain recesses 234 are formed separately to prevent uneven source/drain recesses in different regions due to different layer stacking. In an example process, a patterned mask layer (not shown in the figures) is first formed over the second region 202B. With the first dummy gate stack 231A, the first gate spacer 246 (shown in FIG. 25), and the second gate spacer 248 (shown in FIG. 25) serving as an etch mask, the first region 202A of the workpiece 200 is anisotropically etched to form the first source/drain recesses 232 over the first source/drain region 202A-SD, as shown in FIG. 15. The patterned mask layer over the second region 202B is then removed and another patterned mask layer 233 is formed over the first region 202A to expose the second region. With the second dummy gate stack 231B, the first gate spacer 246 (shown in FIG. 25), and the second gate spacer 248 (shown in FIG. 25) serving as an etch mask, the second region 202B of the workpiece 200 is anisotropically etched to form the second source/drain recesses 234 over the second source/drain region 202B-SD, as shown in FIG. 16. The anisotropic etch at block 126 may include a dry etch process or a suitable etch process. For example, the dry etch process may implement an oxygen-containing gas, hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. As shown in FIGS. 15 and 16, the anisotropic etching at block 124 removes not only the first fin-shaped structures 214A in the first source/drain region 202A-SD and the second fin-shaped structures 214B in the second source/drain region 202B-SD, but also the first APT layer 204 and the second APT layer 206. In FIGS. 25 and 26, operations at block 126 exposes top surfaces of the first fin structures 214AF in the first source/drain recesses 232 and top surfaces of the second fin structures 214BF in the second source/drain recesses 234.

While not explicitly shown in FIGS. 15 and 16, inner spacer features 251 are formed to cap end surfaces of the sacrificial layers 207 in the first channel region 202A-C and the second channel region 202B-C. With sidewall surfaces of the channel layers 208 and the sacrificial layers 207 in the first channel region 202A-C exposed the first source/drain recesses 232 and the second region 202B covered by the patterned mask layer, the sacrificial layers 207 are selectively and partially recessed to form inner spacer recesses, while the exposed channel layers 208 are substantially unetched. In an embodiment where the channel layers 208 consist essentially of silicon (Si), sacrificial layers 207 consist essentially of silicon germanium (SiGe), and the cladding layer 218 consists essentially of silicon germanium (SiGe), the selective and partial recess of the sacrificial layers 207 and the cladding layer 218 may include a SiGe oxidation process followed by a SiGe oxide removal. In that embodiments, the SiGe oxidation process may include use of ozone. In some other embodiments, the selective recess may include a selective isotropic etching process (e.g., a selective dry etching process or a selective wet etching process), and the extent at which the sacrificial layers 207 and the cladding layer 218 are recessed is controlled by duration of the etching process. The selective dry etching process may include use of one or more fluorine-based etchants, such as fluorine gas or hydrofluorocarbons. The selective wet etching process may include APM etch (e.g., ammonia hydroxide-hydrogen peroxide-water mixture). After the formation of the inner spacer recesses, an inner spacer material layer is then conformally deposited using CVD or ALD over the workpiece 200, including over and into the inner spacer recesses and the space left behind by the removed portion of the cladding layer 218. The inner spacer material may include silicon nitride, silicon oxycarbonitride, silicon carbonitride, silicon oxide, silicon oxycarbide, silicon carbide, or silico oxynitride. After the deposition of the inner spacer material layer, the inner spacer material layer is etched back to form inner spacer features 251, as illustrated in FIG. 25. After the formation of the inner spacer features 251 in the first region, similar processes are then performed to the second region 202B to form the inner spacer features 251 in the second region 202B, as shown in FIG. 25.

Figure 17:
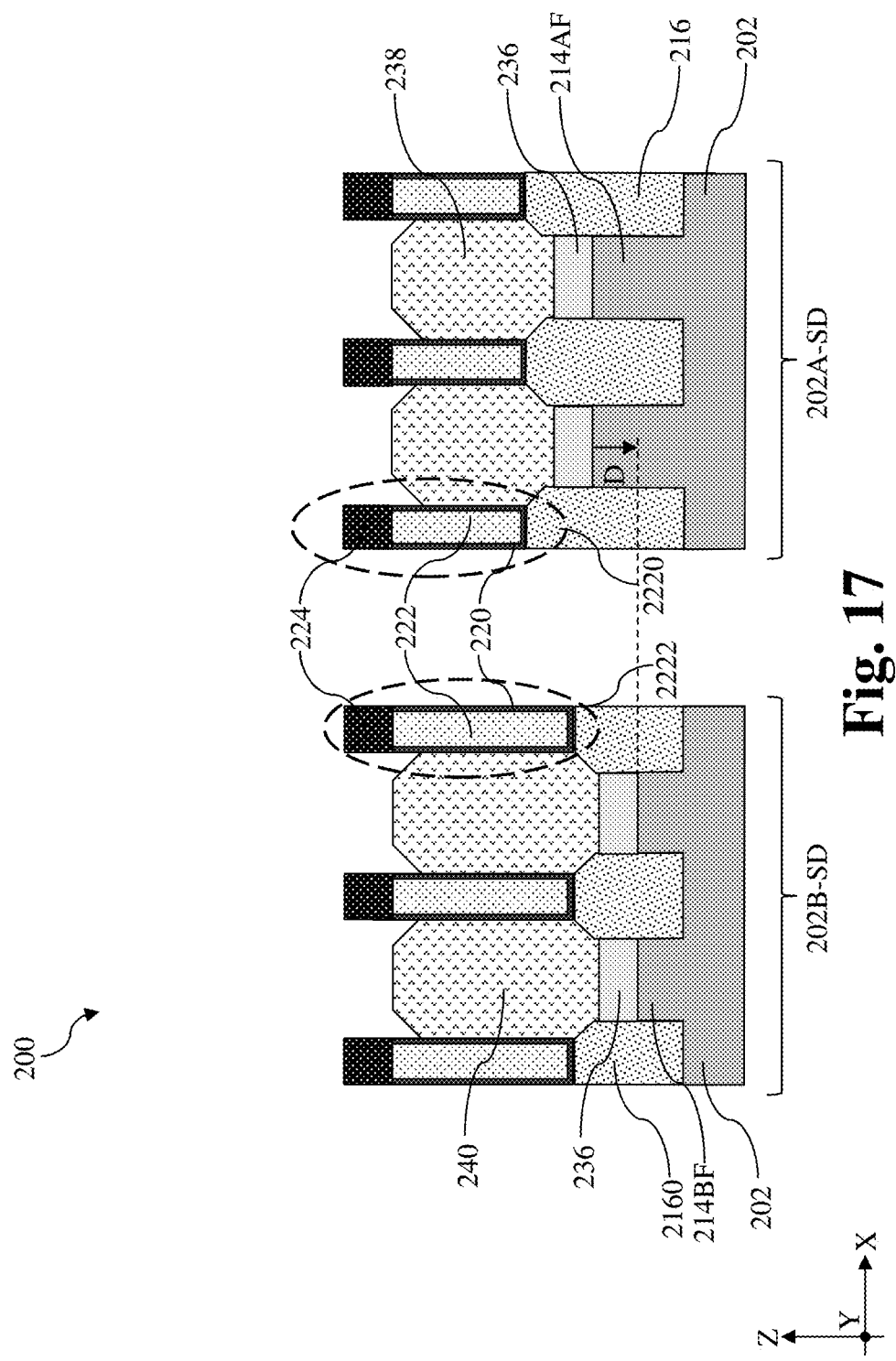

Referring to FIGS. 1A and 17, method 100 optionally includes a block 128 where a dummy epitaxial layer 236 is formed in the first source/drain recesses 232 and the second source/drain recesses 234. The dummy epitaxial layer 236 may include silicon (Si) that is not intentionally doped. Put differently, the dummy epitaxial layer 236 includes undoped silicon (Si). The dummy epitaxial layer 236 may be deposited using an epitaxial process, such as vapor-phase epitaxy (VPE), ultra-high vacuum CVD (UHV-CVD), molecular beam epitaxy (MBE), and/or other suitable processes. As illustrated in FIG. 17, the dummy epitaxial layer 236 is deposited on top surfaces of the first fin structures 214AF and the second fin structures 214BF. The deposition of the dummy epitaxial layer 236 is selective to semiconductor materials and little or no dummy epitaxial layer 236 may be formed on surfaces of the first dielectric fins 2220 and the second dielectric fins 2222. In embodiments that do not include the dummy epitaxial layer 236, operations at block 128 may be omitted. Because the dummy epitaxial layer 236 is undoped, it has high resistance and functions to prevent source/drain leakage into the bulk substrate 202. In embodiments where both dummy epitaxial layer 236 and APT layers are formed, they work in synergy to prevent undesirable leakage into the substrate 202. As shown in FIG. 17, due to the height difference D between the first fin structure 214AF and the second fin structure 214BF, a bottom surface of the dummy epitaxial layer 236 in the first region 202A is higher than a bottom surface of the dummy epitaxial layer 236 in the second region 202B by the difference D. In some instances, the difference D may be between about 10 nm and about 30 nm.

Figure 18:
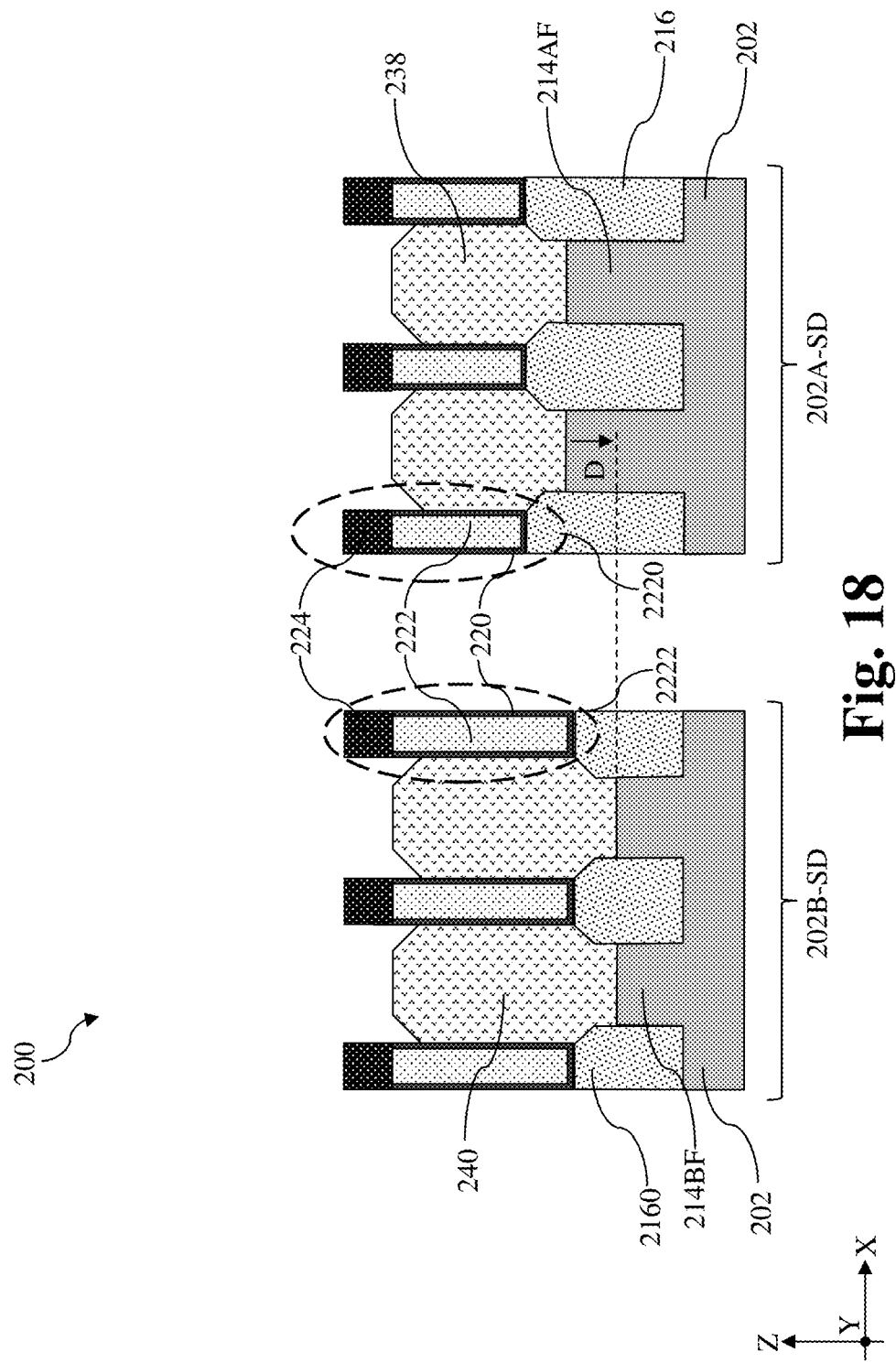

Referring to FIGS. 1B, 17 and 18, method 100 includes a block 130 where first source/drain features 238 are formed in the first source/drain recesses 232 and second source/drain features 240 are formed in the second source/drain recesses 234. In the first region 202A, the first source/drain features 238 are selectively and epitaxially deposited on the exposed semiconductor surfaces of the channel layers 208 and dummy epitaxial layer 236 in the first source/drain recesses 232. In the second region 202B, the second source/drain features 240 are selectively and epitaxially deposited on the exposed semiconductor surfaces of the channel layers 208 and dummy epitaxial layer 236 in the second source/drain recesses 234. The first source/drain features 238 or the second source/drain features 240 may be deposited using an epitaxial process, such as vapor-phase epitaxy (VPE), ultra-high vacuum CVD (UHV-CVD), molecular beam epitaxy (MBE), and/or other suitable processes. The first source/drain features 238 or the second source/drain features 240 may be either n-type or p-type. When the first source/drain features 238 and the second source/drain features 240 are n-type, they may include silicon (Si) and may be doped with an n-type dopant, such as phosphorus (P) or arsenic (As). When the first source/drain features 238 and the second source/drain features 240 are p-type, they may include silicon germanium (SiGe) or germanium (Ge) and may be doped with a p-type dopant, such as boron (B) or boron difluoride ($BF_2$). Doping of the first source/drain features 238 and the second source/drain features 240 may be performed either in situ with their deposition or ex situ using an implantation process, such as a junction implant process. While not explicitly shown in the figures, the first source/drain features 238 and the second source/drain features 240 may each include multiple layers with different dopant concentrations or even different dopant species. It is noted while the first source/drain features 238 and the second source/drain features 240 have different height, they may be satisfactorily formed simultaneously because their formation includes a large lateral growth component from sidewalls of the channel layers 208 (or vertical sidewalls of the substrate 202). In some instances, during the formation of the first source/drain features 238 and the second source/drain features 240, portions of them grow laterally from the sidewalls of the channel layers 208 or vertical sidewalls of the substrate 202 and merge near vertical center lines of the first source/drain features 238 and the second source/drain features 240. As shown in FIG. 18, due to the height difference D between the first fin structure 214AF and the second fin structure 214BF, a bottom surface of the first source/drain feature 238 is higher than a bottom surface of the second source/drain feature 240 by the difference D. In some instances, the difference D may be between about 10 nm and about 30 nm.

Referring to FIG. 17, when the dummy epitaxial layer 236 is deposited at block 128, the first source/drain features 238 and the second source/drain features 240 are deposited on the dummy epitaxial layer 236. Referring to FIG. 18, when the dummy epitaxial layer 236 are omitted, the first source/drain features 238 and the second source/drain features 240 are deposited directly on the top surfaces of the first fin structures 214AF and the second fin structures 214BF.

Figure 19:
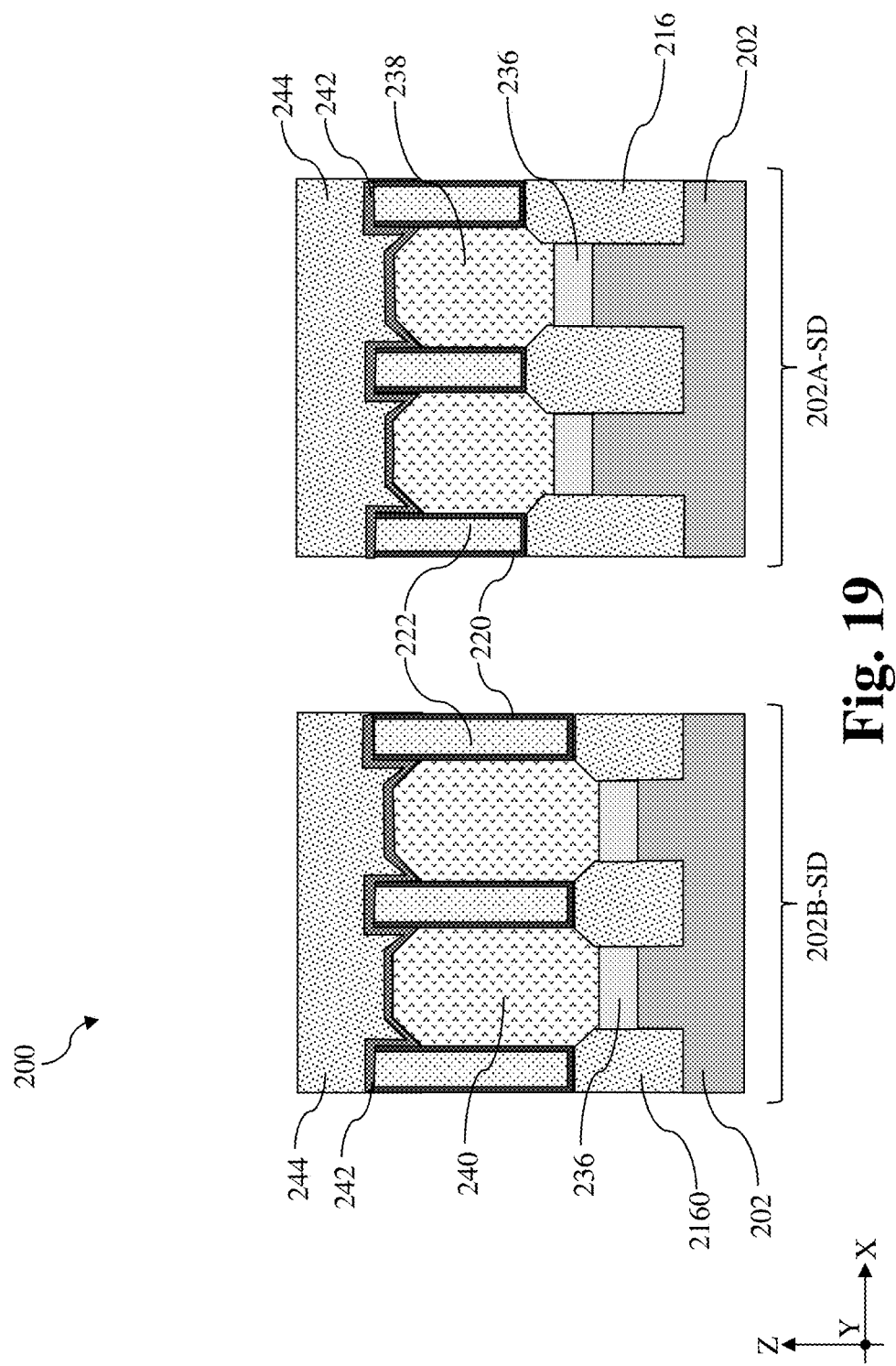

Referring to FIGS. 1B and 19, method 100 includes a block 132 where a contact etch stop layer (CESL) 242 and an interlayer dielectric (ILD) layer 244 are deposited over the workpiece 200. In an example process, the CESL 242 is first conformally deposited over the workpiece 200 and then the ILD layer 244 is blanketly deposited over the CESL 242. The CESL 242 may include silicon nitride, silicon oxide, silicon oxynitride, and/or other materials known in the art. The CESL 242 may be deposited using ALD, plasma-enhanced chemical vapor deposition (PECVD) process and/or other suitable deposition or oxidation processes. In some embodiments, the ILD layer 244 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 244 may be deposited by spin-on coating, FCVD, or other suitable deposition technique. In some embodiments, after formation of the ILD layer 244, the workpiece 200 may be annealed to improve integrity of the ILD layer 244. To remove excess materials, a planarization process (such a chemical mechanical polishing (CMP) process) may be performed to the workpiece 200 to provide a planar top surface as shown in FIG. 19. Top surfaces of the first dummy gate stack 231A and the second dummy gate stack 231B are exposed on the planar top surface.

Figure 20:
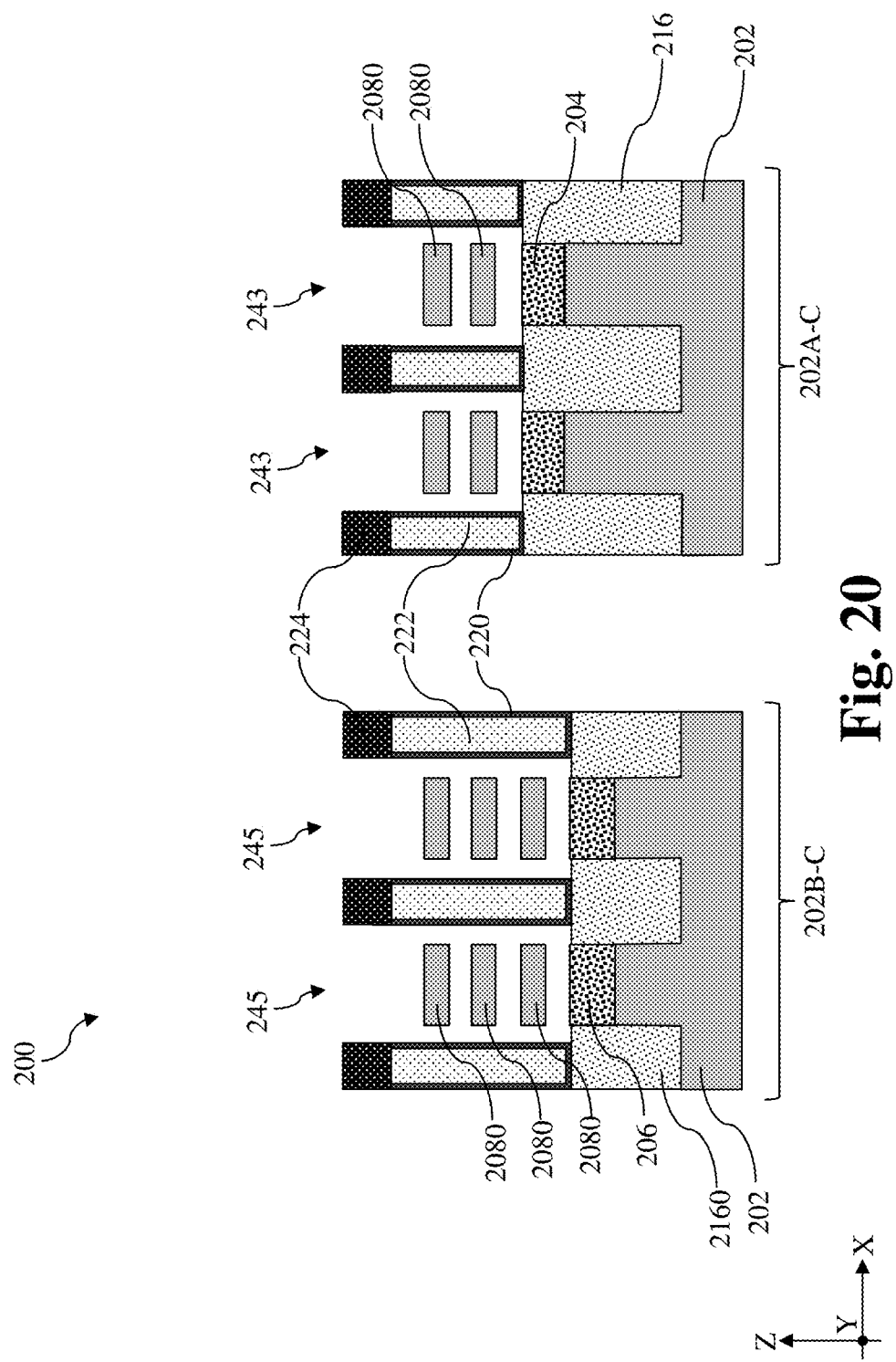
Figure 21:
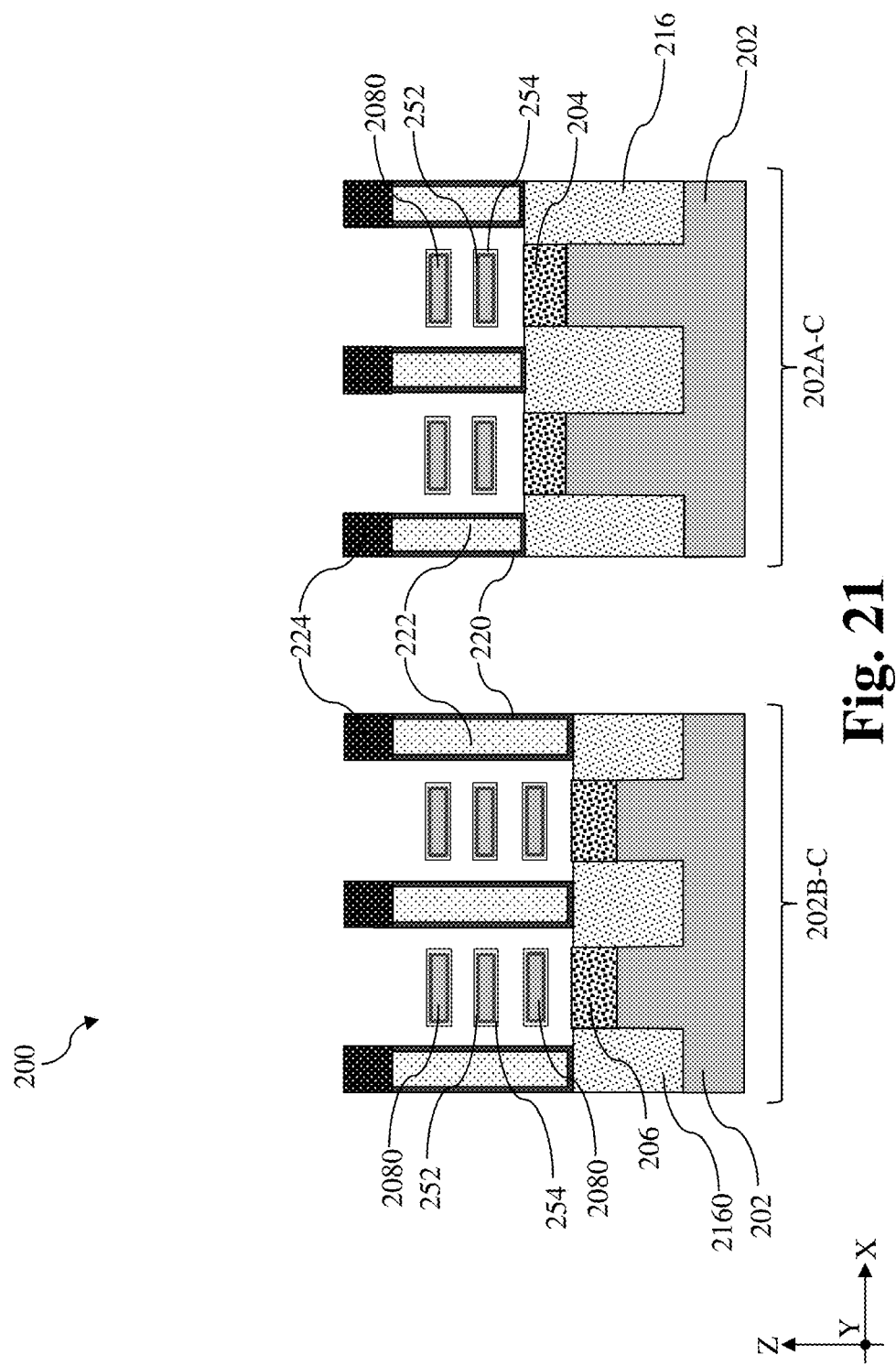

Referring to FIGS. 1B and 20, method 100 includes a block 134 where the first dummy gate stack 231A and the second dummy gate stack 231B are removed and channel members 2080 are released. At block 134, the first dummy gate stack 231A and the second dummy gate stack 231B exposed at the conclusion of block 132 are removed from the workpiece 200 by a selective etch process. The selective etch process may be a selective wet etch process, a selective dry etch process, or a combination thereof. In the depicted embodiments, the selective etch process selectively removes the dummy dielectric layer 225 and the dummy electrode 226 without substantially damaging the first dielectric fins 2220 and the second dielectric fins 2222. The removal of the first dummy gate stack 231A and the second dummy gate stack 231B exposes the cladding layer 218, the channel layers 208 and the sacrificial layers 207 in the first channel region 202A-C and the second channel region 202B-C. The cladding layer 218 and the sacrificial layers 207 in the first channel region 202A-C and the second channel region 202B-C are then selectively removed to release the channel layers 208 to form channel members 2080, shown in FIG. 20. The channel members 2080 are vertically stacked along the Z direction. The selective removal of the sacrificial layers 207 and the cladding layer 218 may be implemented by selective dry etch, selective wet etch, or other selective etch processes. In some embodiments, the selective wet etching includes an APM etch (e.g., ammonia hydroxide-hydrogen peroxide-water mixture). In some alternative embodiments, the selective removal includes silicon germanium oxidation followed by a silicon germanium oxide removal. For example, the oxidation may be provided by ozone clean and then silicon germanium oxide removed by an etchant such as $NH_4OH$. With the removal of the sacrificial layers 207 and the cladding layer 218 in the channel region, the channel members 2080, top surfaces of the first APT features 204, top surfaces of the second APT features 206, the isolation feature 216, and the recessed isolation feature 2160 are exposed in first gate trenches 243 in the first channel region 202A-C and in second gate trenches 245 in the second channel region 202B-C. As shown in FIG. 20, two channel members 2080 are exposed in a first gate trench 243 while three channel members 2080 are exposed in a second gate trench 245. When the first APT layer 204 and the second APT layer 206 are not formed, top surfaces of the first fin structures 214AF and the second fin structures 214BF are exposed in the first gate trenches 243 and the second gate trenches 245, respectively.

Figure 22:
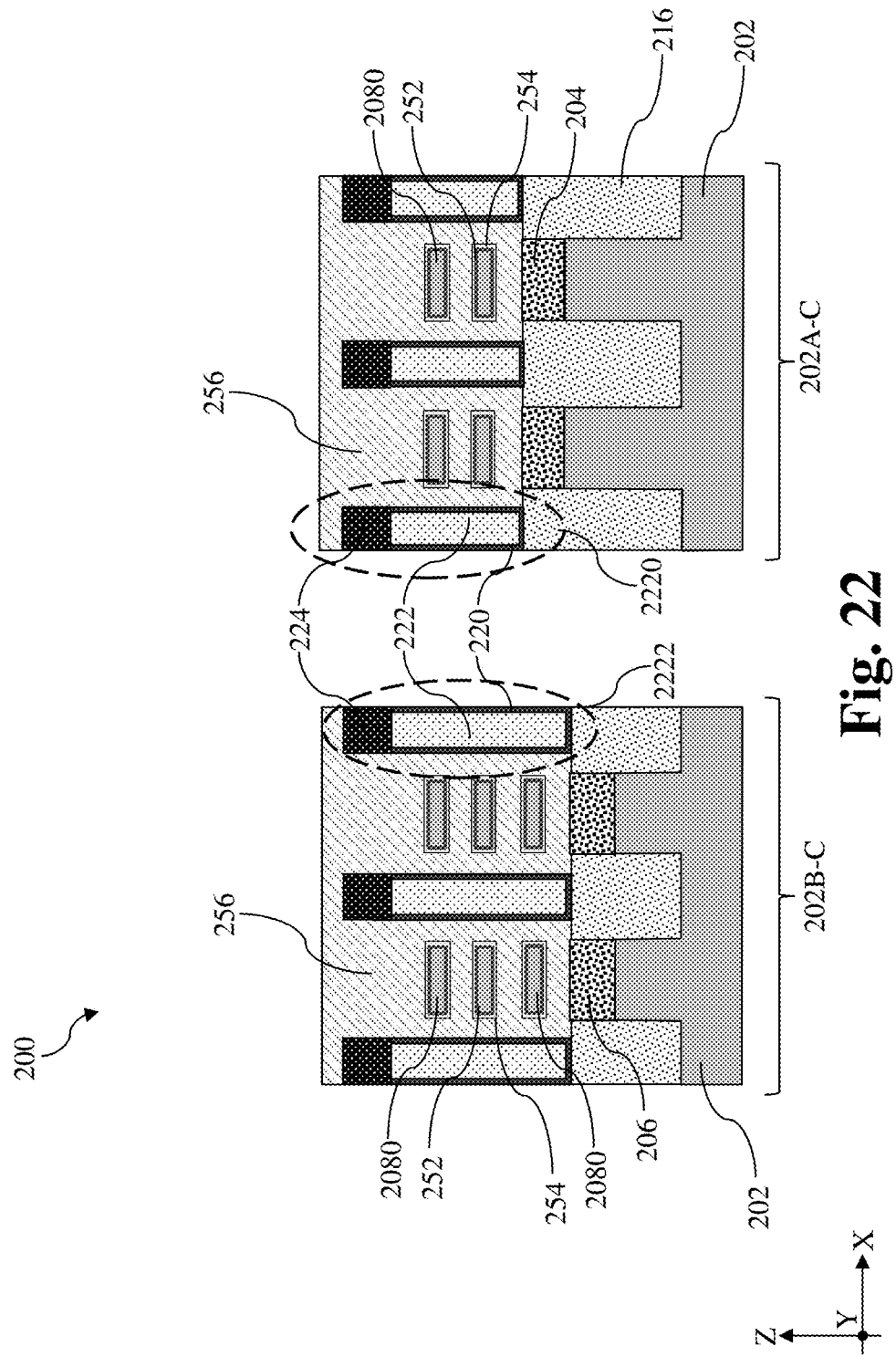

Referring to FIGS. 1B, 21, 22, and 23, method 100 includes a block 136 where a first gate structure 258 is formed over the first region 202A and a second gate structure 260 is formed over the second region 202B. Each of the first gate structure 258 and the second gate structure 260 may include an interfacial layer 252 on the channel members 2080, a gate dielectric layer 254 over the interfacial layer 252, and a gate electrode layer 256 over the gate dielectric layer 254. In some embodiments, the interfacial layer 252 may include silicon oxide and may be formed as result of a pre-clean process. An example pre-clean process may include use of RCA SC-1 (ammonia, hydrogen peroxide and water) and/or RCA SC-2 (hydrochloric acid, hydrogen peroxide and water). The pre-clean process oxidizes the exposed surfaces of the channel members 2080 to form the interfacial layer 252. The gate dielectric layer 254 is then deposited over the interfacial layer 252 using ALD, CVD, and/or other suitable methods. The gate dielectric layer 254 may include high-K dielectric materials. As used herein, high-k dielectric materials include dielectric materials having a high dielectric constant, for example, greater than that of thermal silicon oxide (~3.9). In one embodiment, the gate dielectric layer 254 may include hafnium oxide. Alternatively, the gate dielectric layer 254 may include other high-K dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr)$TiO_3$ (BST), silicon nitride (SiN), silicon oxynitride (SiON), combinations thereof, or other suitable material. After the formation or deposition of the interfacial layer 252 and the gate dielectric layer 254, a gate electrode layer 256 is deposited over the gate dielectric layer 254. The gate electrode layer 256 may be a multi-layer structure that includes at least one work function layer and a metal fill layer. By way of example, the at least one work function layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), or tantalum carbide (TaC). The metal fill layer may include aluminum (Al), tungsten (W), nickel (Ni), titanium (Ti), ruthenium (Ru), cobalt (Co), platinum (Pt), tantalum silicon nitride (TaSiN), copper (Cu), other refractory metals, or other suitable metal materials or a combination thereof. In various embodiments, the gate electrode layer 256 may be formed by ALD, PVD, CVD, e-beam evaporation, or other suitable process. In various embodiments, a planarization process, such as a CMP process, may be performed to remove excessive materials to provide a substantially planar top surface of the gate structures. Referring to FIG. 22, the interfacial layer 252, the gate dielectric layer 254, and the gate electrode layer 256 wrap around each of the channel members 2080 and are divided by the first dielectric fins 2220 and the second dielectric fins 2222.

Figure 23:
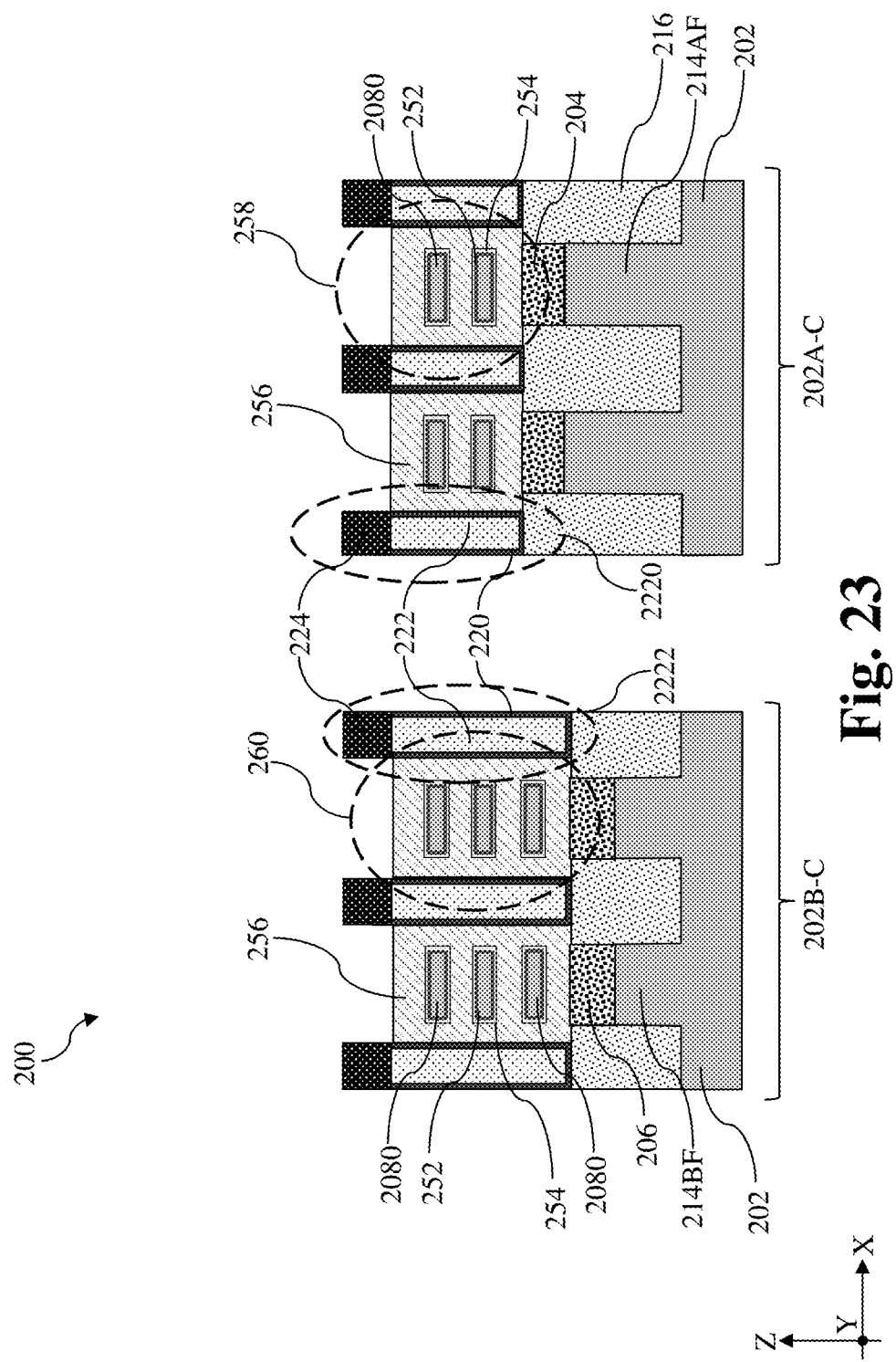

Referring now to FIG. 23, the gate electrode layer 256 is then etched back until the first dielectric fins 2220 and the second dielectric fins 2222 rise above the gate electrode layer 256 to define the first gate structures 258 over the first channel region 202A-C and the second channel region 202B-C. In the depicted embodiments, the etch back of the gate electrode layer 256 is performed until the helmet layer 224 rises above the gate electrode layer 256. As shown in FIG. 23, each of the first gate structures 258 wraps around two vertically stacked channel members 2080 in the first channel region 202A-C while each of the second gate structures 260 wraps around two vertically stacked channel members 2080 in the second channel region 202B-C. In the depicted embodiments, the first gate structures 258 and the second gate structures 260 are disposed directly on the first APT layer 204 and the second APT layer 206, respectively. In embodiments where the first APT layer 204 and the second APT layer 206 are not formed, the first gate structures 258 and the second gate structures are disposed directly on the first fin structures 214AF and the second fin structures 214BF, respectively. In some alternative embodiments, the etch back of the gate electrode layer 256 also etches back the helmet layers 224.

Figure 24:
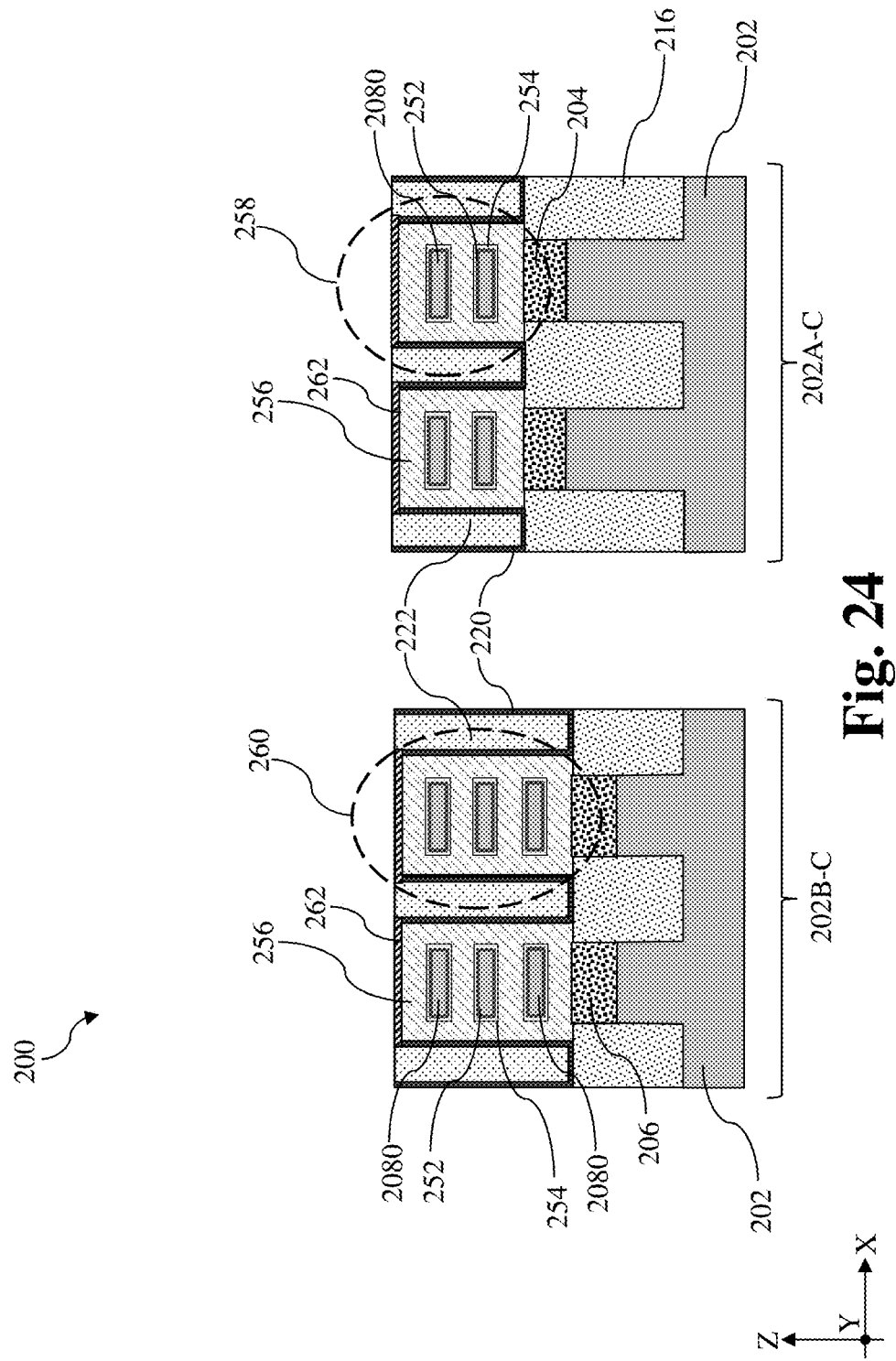

Referring to FIGS. 1B and 24-26, method 100 includes a block 138 where a first gate-top metal layer 262 is deposited on the first gate structures 258 and the second gate structures 260. At block 138, the first gate-top metal layer 262 is deposited over the workpiece 200, including on the exposed first gate structures 258, the second gate structures 260, and the helmet layers 224. In some embodiments, the first gate-top metal layer 262 may include titanium (Ti), titanium nitride (TiN), tantalum nitride (TaN), tungsten (W), ruthenium (Ru), aluminum (Al), cobalt (Co), nickel (Ni), or a suitable metal. The first gate-top metal layer 262 may be deposited using CVD or metal organic chemical vapor deposition (MOCVD). In one embodiment, the first gate-top metal layer 262 may include fluorine-free tungsten (W) and may be deposited using MOCVD. After the deposition of the first gate-top metal layer 262, the first dielectric fins 2220 and the second dielectric fins 2222 are etched back, as shown in FIG. 24. When viewed along the X direction, the first gate-top metal layer 262 is disposed between the first gate spacers 246, as shown in FIGS. 25 and 26. In embodiments represented in FIG. 25, the dummy epitaxial layer 236, the first APT layer 204, and the second APT layer 206 are all formed. In FIG. 25, the dummy epitaxial layer 236 is in direct contact with the first APT layer 204 and the second APT layer 206. Due to the presence of the dummy epitaxial layer 236, the first source/drain feature 238 is spaced apart from the first APT layer 204. Similarly, the second source/drain feature 240 is spaced apart from the second APT layer 206. In embodiments represented in FIG. 26, when the dummy epitaxial layer 236 is not formed, the first source/drain features 238 is allowed to directly contact the first APT layer 204 and the second source/drain features 240 is allowed to directly contact the second APT layer 206.

In some alternative embodiments (not shown) where the helmet layer 224 is etched back along with the gate electrode layer 256, the first gate-top metal layer 262 may be blanketly deposited over the workpiece 200 and extends continuously over the first dielectric fins 2220 and the second dielectric fins 2222.

Figure 27:
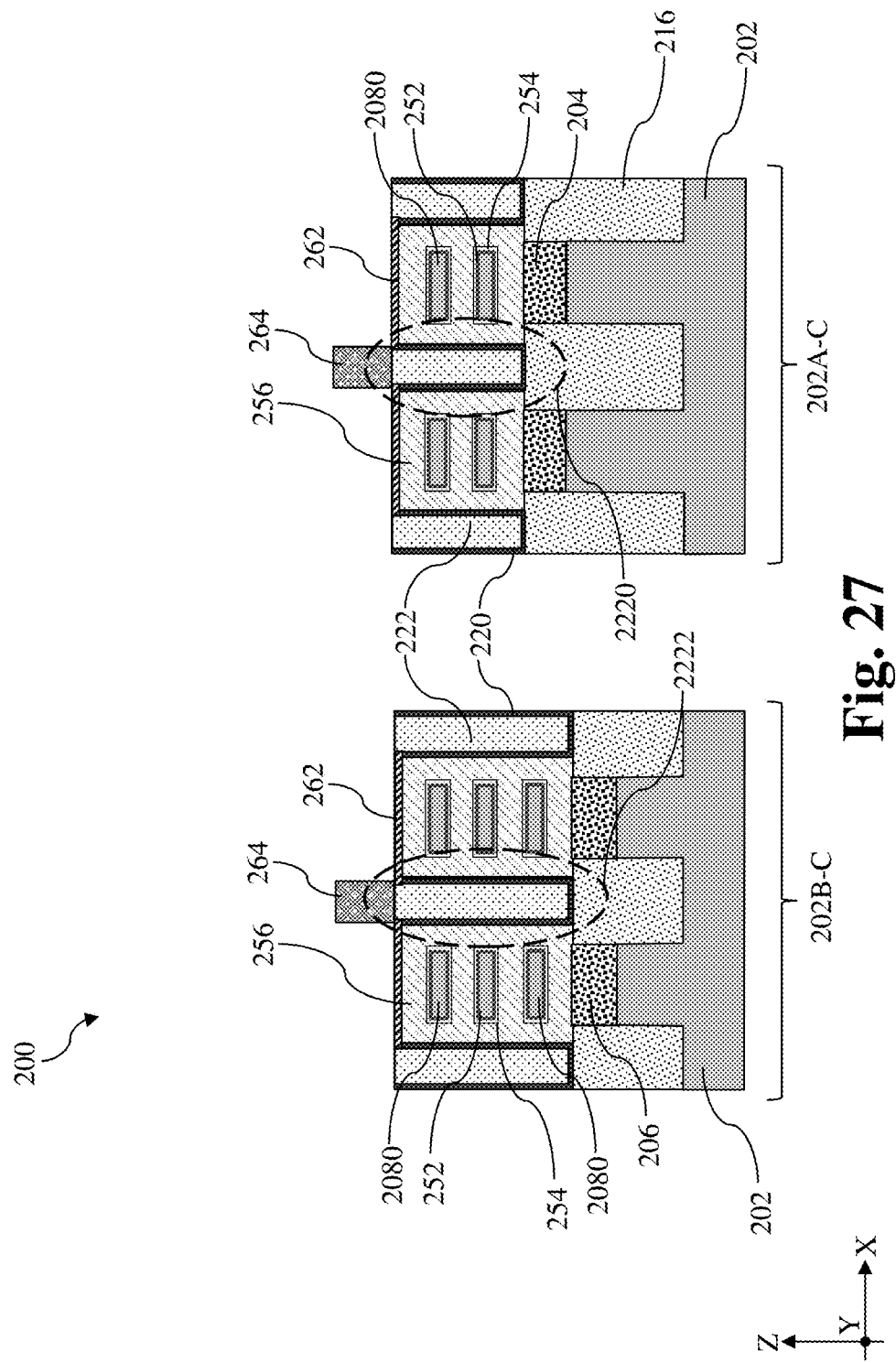

Referring to FIGS. 1B and 27, method 100 includes a block 140 where gate cut features 264 are formed. Gate cut features 264 may also be referred to cut metal gate (CMG) features 264 as they function to separate otherwise electrically connected gate segments. In some embodiments, a material layer is deposited over the workpiece 200 and gate cut openings are formed in the material layer. The material for the gate cut features 264 are then deposited into the gate cut openings. After a chemical mechanical polishing process to remove excess material over the material layer, the material layer is removed, leaving the gate cut features 264. The material layer may be a photoresist layer, a bottom antireflective coating (BARC) layer, a silicon oxide layer, or a silicon layer. In one embodiment, the material layer may be silicon layer. The gate cut features 264 may include silicon nitride, silicon oxynitride, or a metal oxide. In one embodiment, the gate cut features 264 may be formed of silicon nitride. As shown in FIG. 27, the gate cut features 264 are formed directly over the first dielectric fins 2220 and the second dielectric fins 2222.

Figure 28:
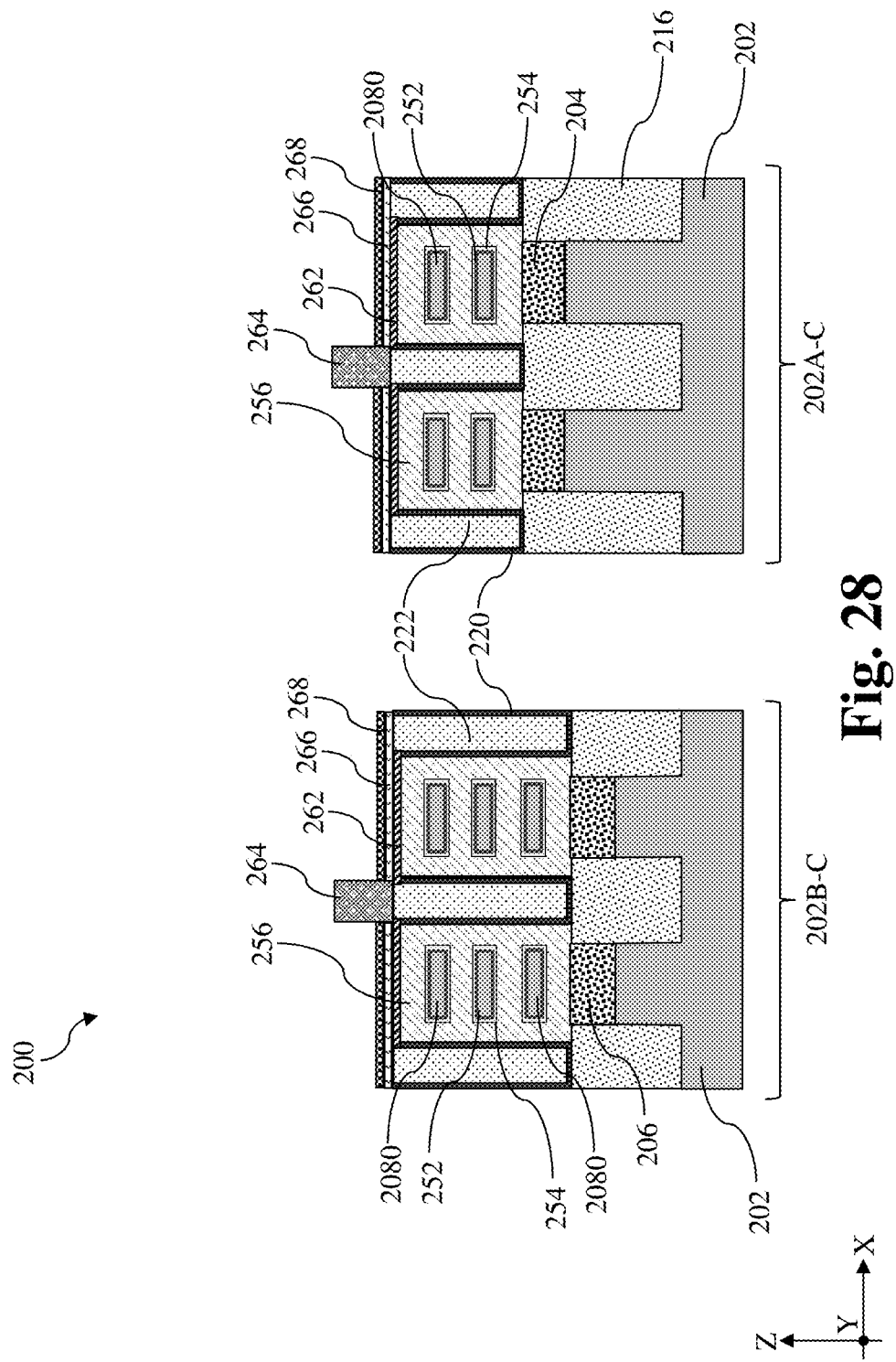

Referring to FIGS. 1B and 28, method 100 includes a block 142 where a second gate-top metal layer 266 and a third gate-top metal layer 268 are formed over the first gate-top metal layer 262. In some embodiments, the second gate-top metal layer 266 may include titanium (Ti), titanium nitride (TiN), tantalum nitride (TaN), tungsten (W), ruthenium (Ru), aluminum (Al), cobalt (Co), or nickel (No) and the third gate-top metal layer 268 is fluorine-free tungsten (W) layer. In an example process, the second gate-top metal layer 266 is first deposited over the workpiece 200 using PVD or CVD. The deposited second gate-top metal layer 266 is then etched back to remove the second gate-top metal layer 266 disposed over the top surface of the gate cut features 264, thereby allowing the gate cut features 264 to divide the second gate-top metal layer 266 into segments. The second gate-top metal layer 266 may be regarded as a seed layer for the third gate-top metal layer 268. The third gate-top metal layer 268 is then selectively deposited over the second gate-top metal layer 262 using MOCVD or CVD. Upon conclusion of the operations at block 142, the gate cut features 264 divide the second gate-top metal layer 266 and the third gate-top metal layer 268 into segments. In areas where the gate cut features 264 are not formed, the second gate-top metal layer 266 and the third gate-top metal layer 268 may span over the dielectric fins (such as the first dielectric fins 2220 and the second dielectric fins 2222) to serve as local interconnects that couple adjacent gate structures.

In embodiments where the helmet layer 224 are etched back along with the gate electrode layer 256, the second gate-top metal layer 266 and the third gate-top metal layer 268 may not be formed. In those embodiments, a patterned silicon hard mask layer may be deposited over the first gate-top metal layer 262 and the first gate-top metal layer 262 is etched using the patterned silicon hard mask layer to form a gate cut opening. A dielectric material is then deposited into the gate cut opening to form the gate cut feature 264.

Figure 29:
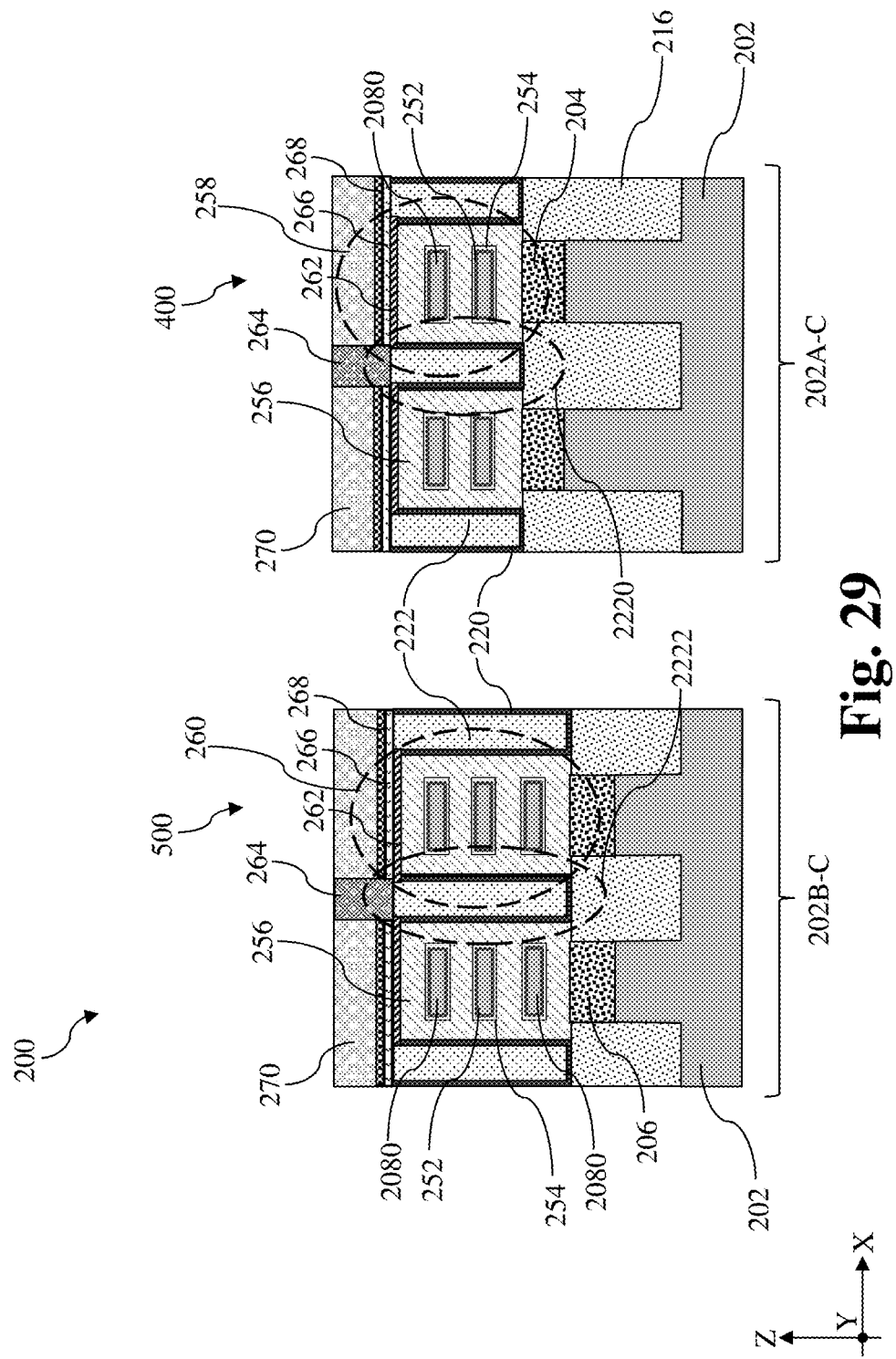

Referring to FIGS. 1B and 29, method 100 includes a block 144 where a self-aligned capping (SAC) layer 270 is formed over the third gate-top metal layer 268. In some embodiments, the SAC layer 270 may include silicon oxide, silicon nitride, silicon carbide, silicon carbonitride, silicon oxynitride, silicon oxycarbonitride, aluminum oxide, aluminum nitride, aluminum oxynitride, zirconium oxide, zirconium nitride, zirconium aluminum oxide, hafnium oxide, or a suitable dielectric material. The SAC layer 270 may be deposited using CVD, ALD, PEALD, or a suitable method. After the deposition of the SAC layer 270, a chemical mechanical polishing (CMP) may be performed to remove excess SAC layer 270. As shown in FIG. 29, the SAC layer 270 is deposited on the third gate-top metal layer 268 and remains divided by the gate cut feature 264.

Upon conclusion of operations at block 144, a first MBC transistor 400 over the first region 202A (the first channel region 202A-C is in the first region 202A) and a second MBC transistor 500 over the second region 202B (the second channel region 202B-C is in the second region 202B) are formed, as shown in FIG. 29. In the depicted embodiments, the first MBC transistor 400 includes two vertically stacked channel members 2080 that are wrapped around by the first gate structure 258. The first MBC transistor 400 is isolated from a neighboring first MBC transistor 400 by the first dielectric fin 2220 and the gate cut feature 264. Along the Y direction, the two vertically stacked channel members 2080 of the first MBC transistor 400 extend between two first source/drain features 238 (shown in FIG. 19 or 29). The second MBC transistor 500 transistor includes three vertically staked channel members 2080 that are wrapped around by the second gate structure 260. The second MBC transistor 500 is isolated from a neighboring second MBC transistor 500 by the second dielectric fin 2222 and the gate cut feature 264. Along the Y direction, the three vertically stacked channel members 2080 of the second MBC transistor 500 extend between two second source/drain features 240 (shown in FIG. 19 or 29). Compared to the second MBC transistor 500, the first MBC transistor 400 has one less channel member 2080 and a smaller first gate structure 258, giving it a smaller areal overlap with neighboring first source/drain features 238 and a smaller parasitic gate-drain capacitance (Cgd). The smaller parasitic gate-drain capacitance allows the first MBC transistor 400 to switch faster in alternating current (AC) applications. Compared to the first MBC transistor 400, the second MBC transistor 500 has one additional channel member 2080 to conduct On-state current, giving it greater On-state current. The greater On-state current makes the second MBC transistor 500 more suitable for high current (HC) or high performance computing (HPC) applications. It is noted that the present disclosure is limited to embodiments that only include a 3-channel-member MBC transistor and a 2-channel member MBC transistor. The present disclosure contemplates semiconductor devices that include at least two type MBC transistors that have different numbers of channel members.

Figure 30:
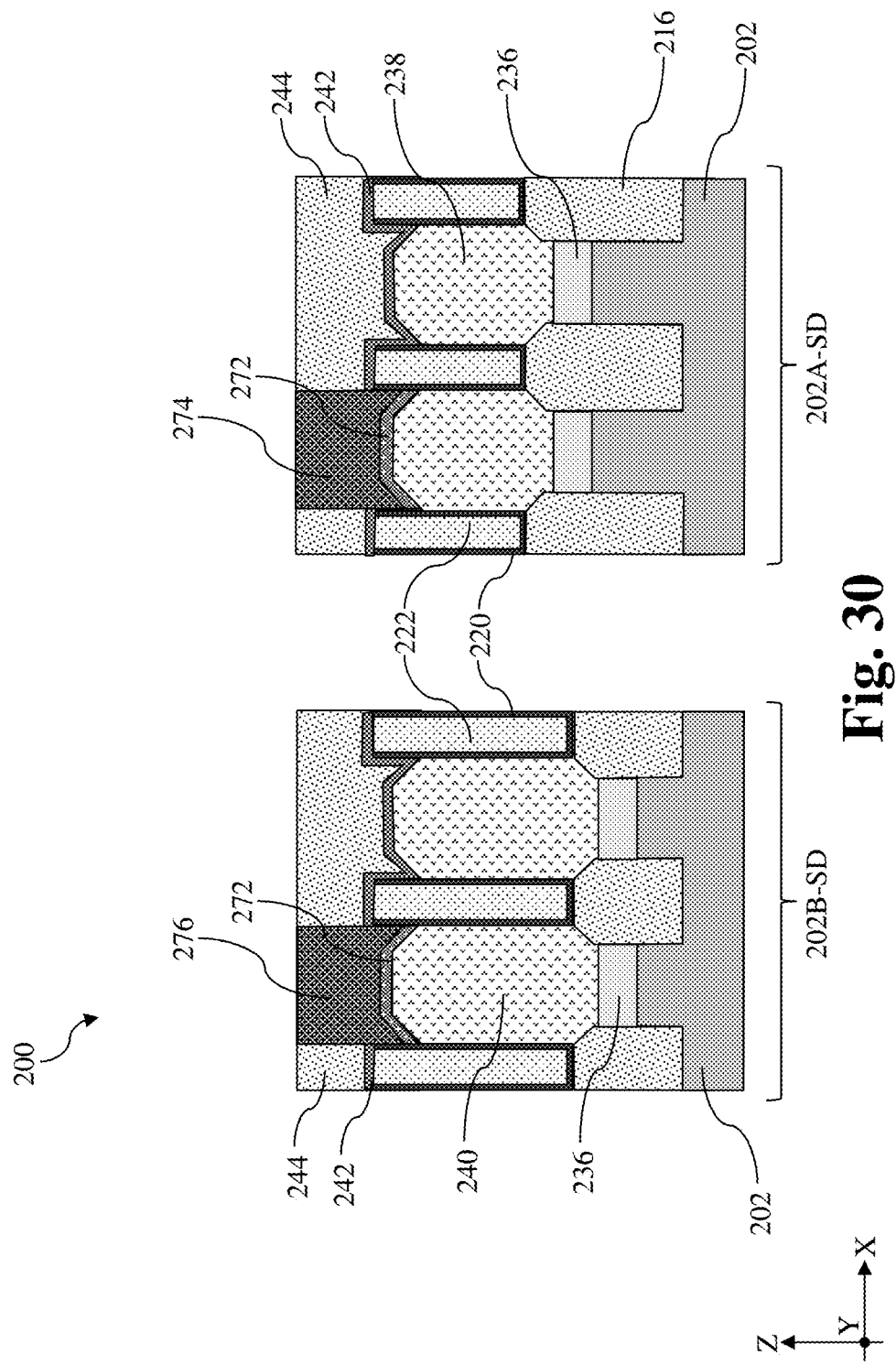

Referring to FIGS. 1B and 30, method 100 includes a block 146 where a first source/drain contact 274 and a second source/drain contact 276 are formed. After the formation of the SAC layer 270, source/drain contact openings are formed through the ILD layer 244 and the CESL 242 to expose the first source/drain feature 238 and the second source/drain feature 240. A silicide precursor layer is then deposited over the exposed first source/drain feature 238 and the exposed second source/drain feature 240. The silicide precursor layer may include titanium (Ti), tantalum (Ta), nickel (Ni), cobalt (Co), or tungsten (W). The workpiece 200 is then annealed to bring about silicidation reaction between the silicide precursor layer and the first source/drain feature 238 and between the silicide precursor layer and the second source/drain feature 240 to form silicide features 272. The silicide features 272 may be formed of titanium silicide, tantalum silicide, nickel silicide, cobalt silicide, or tungsten silicide. A metal fill layer is then deposited into the source/drain openings and is planarized to form the first source/drain contact 274 and the second source/drain contact 276. The metal fill layer may include aluminum (Al), copper (Cu), ruthenium (Ru), nickel (Ni), molybdenum (Mo), or tungsten (W). The first source/drain contact 274 is electrically coupled to the first source/drain feature 238 by way of the silicide feature 272. The second source/drain contact 276 is electrically coupled to the second source/drain feature 240 by way of the silicide feature 272.

Figure 31:
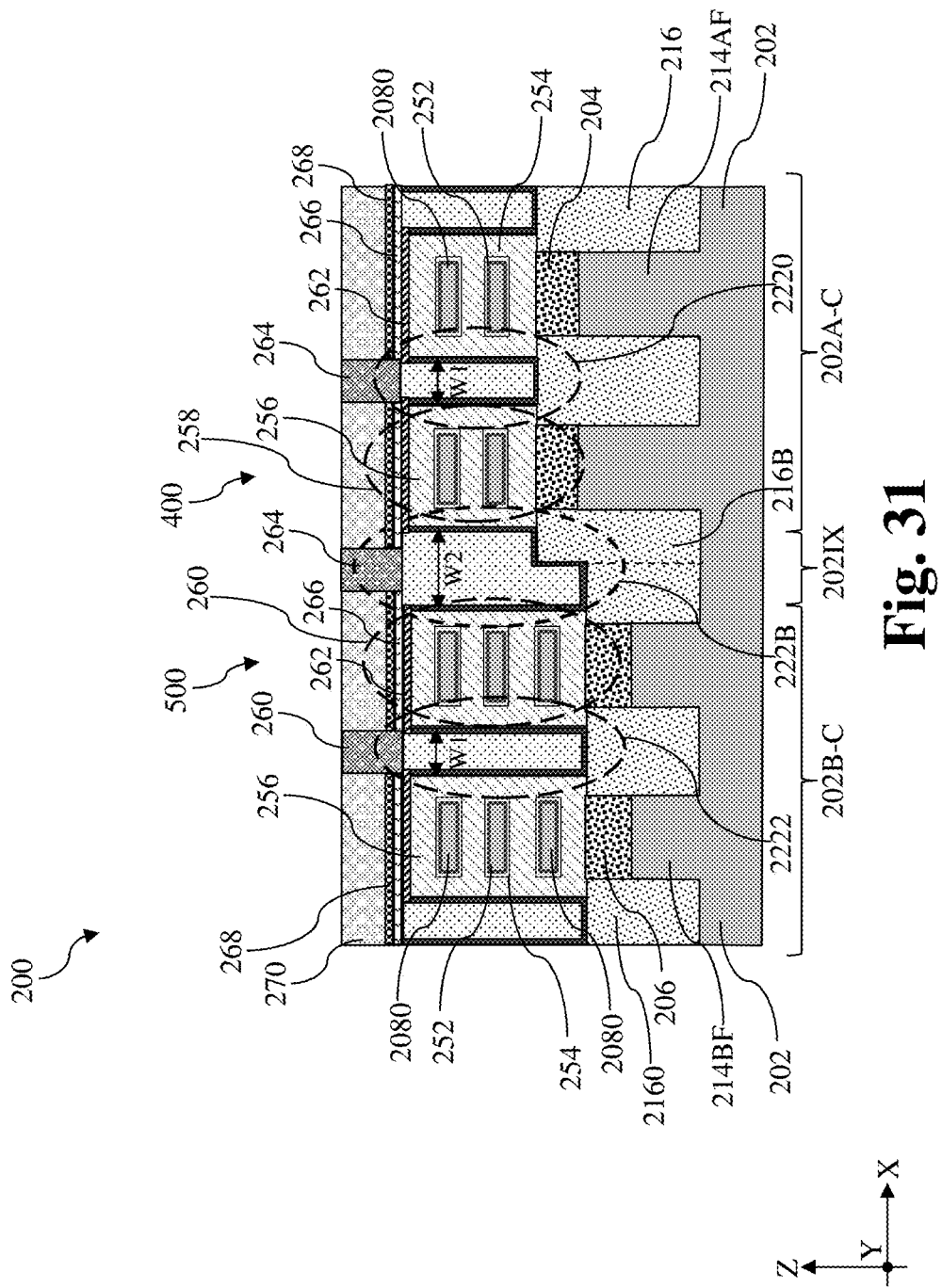
FIGS. 31-36 illustrate interface regions of different MBC transistors, according to one or more aspects of the present disclosure.
Figure 32:
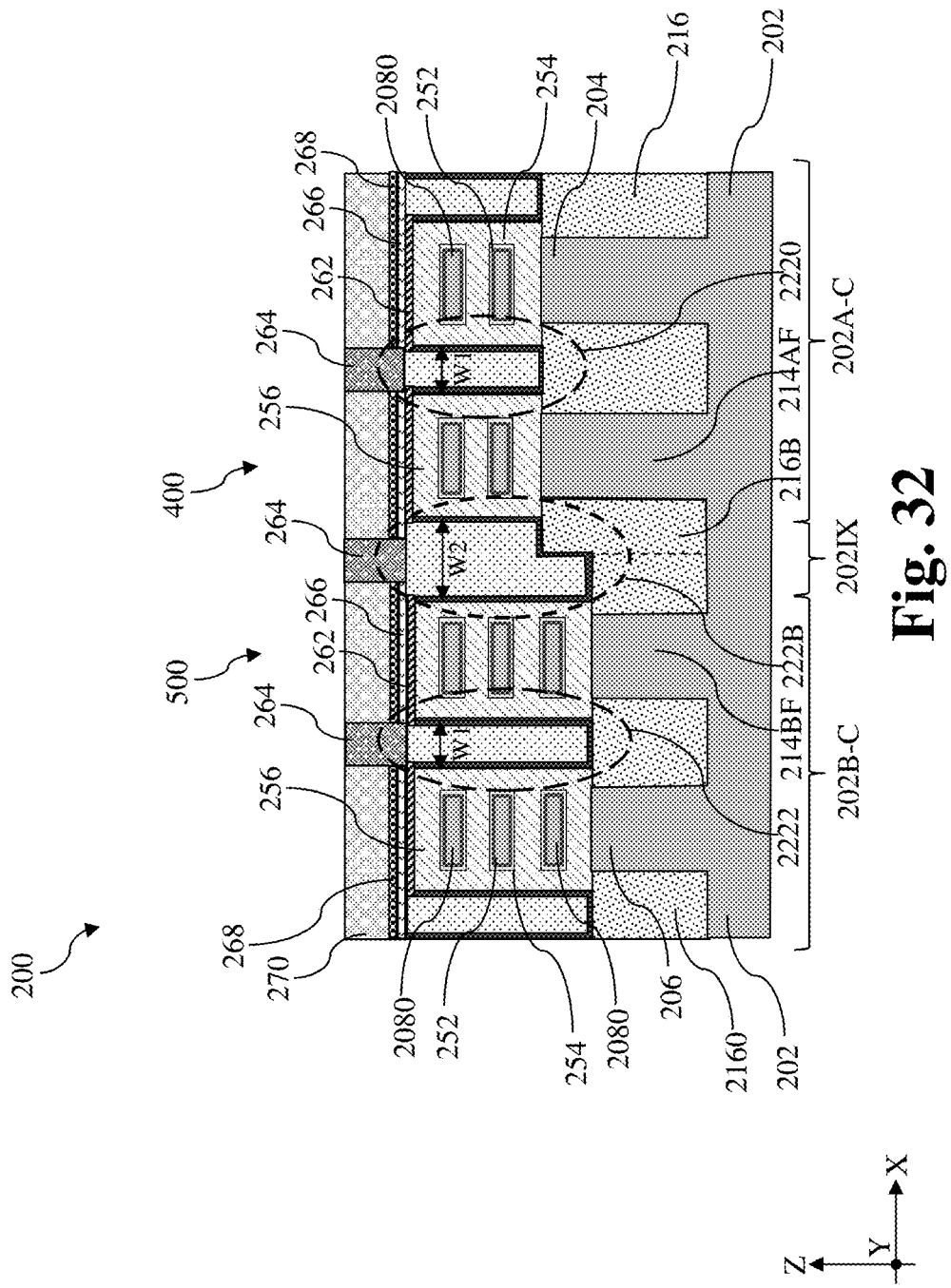
Figure 33:
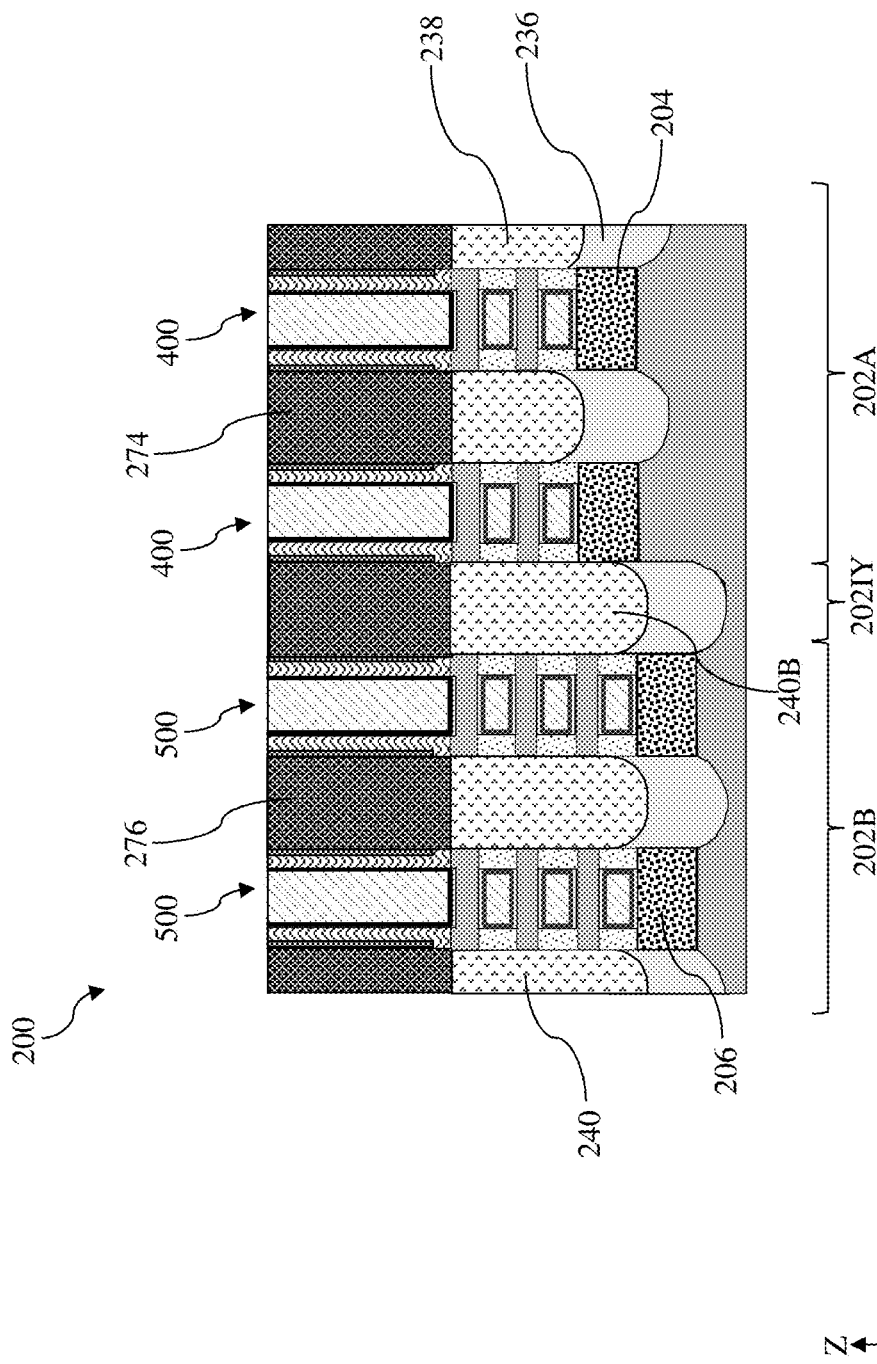
Figure 34:
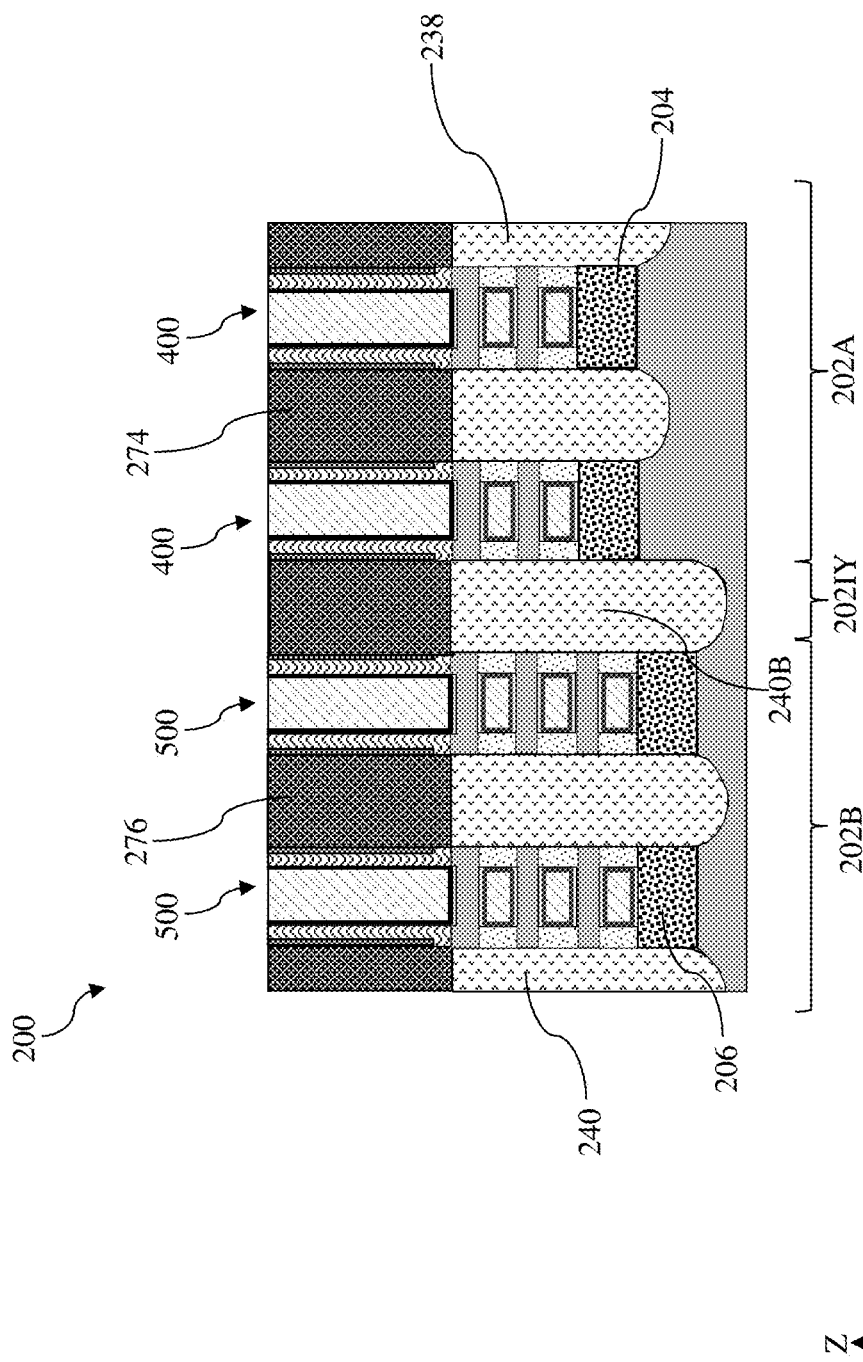
Figure 35:
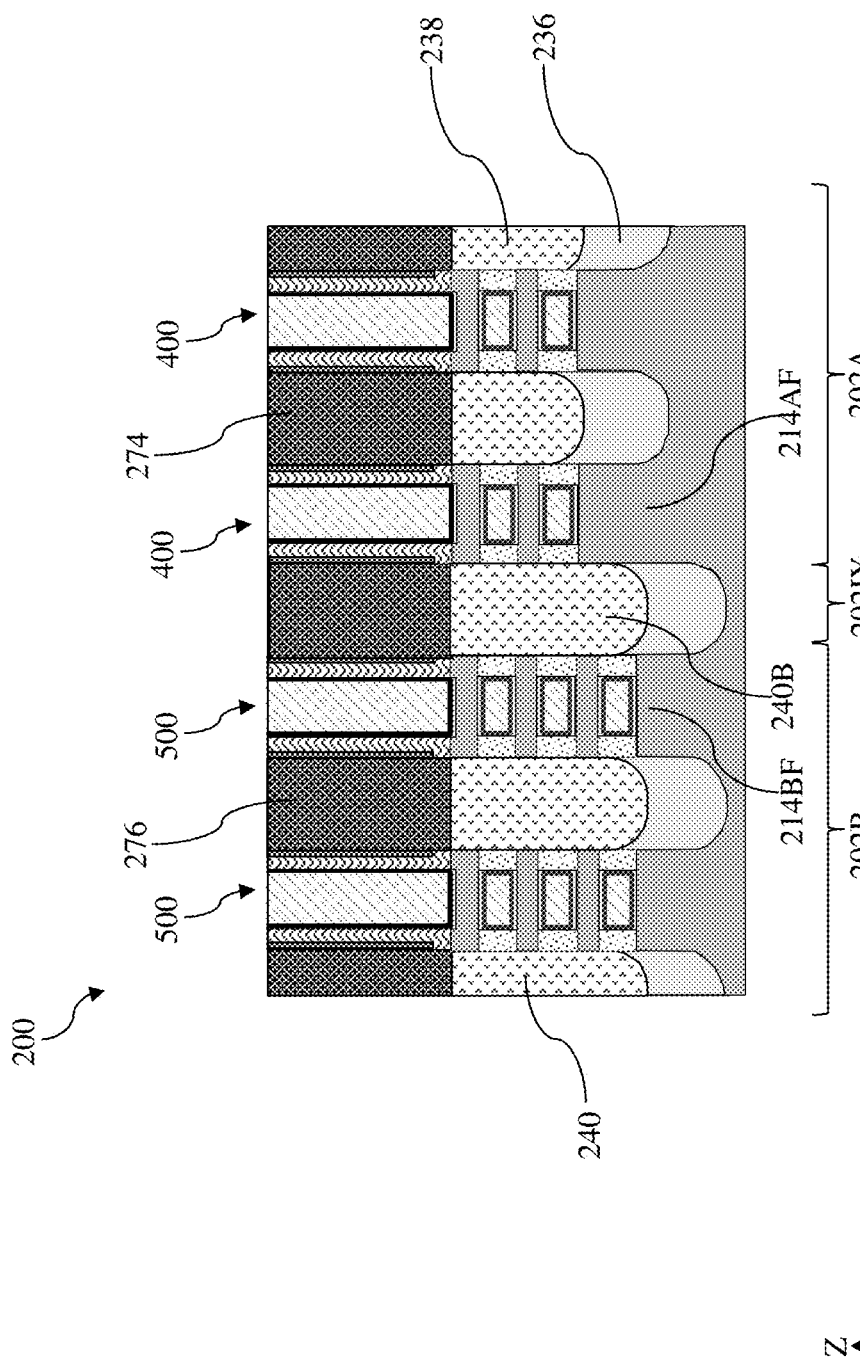
Figure 36:
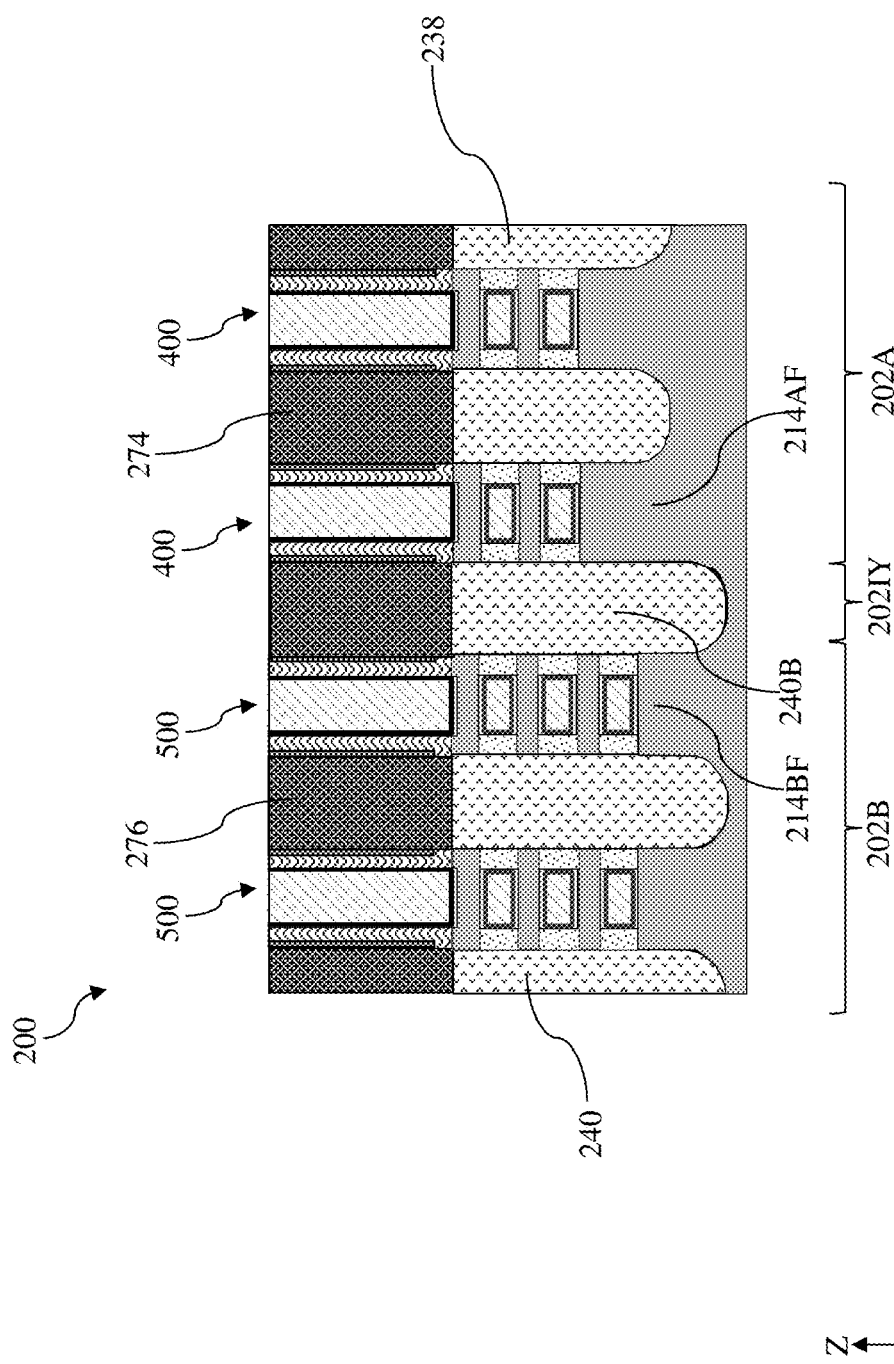

FIGS. 31-36 illustrate boundaries between a first MBC transistor 400 and a second MBC transistor 500 according to various embodiments of the present disclosure. Referring first to FIGS. 31 and 32, a first MBC transistor 400 may interface a second MBC transistor 500 at a first interface region 202IX along the X direction. The first interface region 202IX may include anomalies. For example, an edge of the fifth patterned mask 217 using in block 116 may be directly over a boundary isolation feature 216B. The boundary isolation feature 216B includes a transition from the isolation feature 216 to the recessed isolation feature 2160 and has a stair-like top surface that goes through a step change in levels. In the depicted embodiments, a right half of the boundary isolation feature 216B shares the same depth (or thickness) with the isolation feature 216 and a left half of the boundary isolation feature 216B share the same depth (or thickness) with the recessed isolation feature 2160. In other words, a top surface of the right half of the boundary isolation feature 216B is coplanar with the top surface of the isolation feature 216 while a top surface of the left half of the boundary isolation feature 216B is coplanar with the top surface of the recessed isolation feature 2160. A boundary dielectric fin 222B disposed on the boundary isolation feature 216B includes a bottom profile to accommodate the shapes of the boundary isolation feature 216B. Like the boundary isolation feature 216B, the boundary dielectric fin 222B includes a stair-like bottom surface that goes through a similar step change in levels. As shown in FIGS. 31 and 32, a bottom surface of a right side of the boundary dielectric fin 222B is disposed directly on the right side of the boundary isolation feature 216B and a bottom surface of a left side of the boundary dielectric fin 222B is disposed directly on the left side of the boundary isolation feature 216B. In some implementations, a first width W1 of the first dielectric fin 2220 or the second dielectric fin 2222 may be equal to or smaller than a second width W2 of the boundary dielectric fin 222B. In some embodiments, the second width W2 may be more than three times of the first width W1. In the embodiments represented in FIG. 31, the first MBC transistor 400 includes the first APT feature 204 disposed below the first gate structure 258 and the second MBC transistor 500 includes the second APT feature 206 disposed below the second gate structure 260. In the embodiments represented in FIG. 32, the first APT feature 204 and the second APT feature 206 are not formed. The first gate structure 258 is disposed directly over the first fin structure 214AF and the second gate structure 260 is disposed directly over the second fin structure 214BF.

Referring first to FIGS. 33-36, a first MBC transistor 400 may interface a second MBC transistor 500 at a second interface region 202IY along the Y direction. The second interface region 202IY may be vertically aligned with a boundary source/drain feature 240B. In FIGS. 33-36, the boundary source/drain feature 240B may be similar to the deep one of the first source/drain feature 238 and the second source/drain feature 240. In the depicted embodiment, because the second source/drain feature 240 extends further into the substrate 202 and is deeper, the boundary source/drain feature 240B may be similar to the second source/drain feature 240. The boundary source/drain feature 240B is sandwiched between the channel members 208O of a first MBC transistor 400 and a second MBC transistor 500. In other words, the boundary source/drain feature 240B may be shared by a first MBC transistor 400 and a second MBC transistor 500. In embodiments represented in FIG. 33, the first MBC transistor 400 is disposed over the first APT feature 204, the second MBC transistor 500 is disposed over the second APT feature 206, and the source/drain features (the first source/drain features 238, the second source/drain features 240, and the boundary source/drain feature 240B) are disposed on the dummy epitaxial layer 236. In embodiments represented in FIG. 34, the first MBC transistor 400 is disposed over the first APT feature 204, the second MBC transistor 500 is disposed over the second APT feature 206, but the dummy epitaxial layer 236 is omitted. In embodiments represented in FIG. 35, the first MBC transistor 400 is disposed over the first fin structure 214AF, the second MBC transistor 500 is disposed over the second fin structure 214BF, and the source/drain features (the first source/drain features 238, the second source/drain features 240, and the boundary source/drain feature 240B) are disposed on the dummy epitaxial layer 236. In embodiments represented in FIG. 36, the first MBC transistor 400 is disposed over the first fin structure 214AF, the second MBC transistor 500 is disposed over the second fin structure 214BF, and the source/drain features (the first source/drain features 238, the second source/drain features 240, and the boundary source/drain feature 240B) are disposed on the substrate 202.

Based on the above discussions, it can be seen that the present disclosure offers advantages over conventional processes. It is understood, however, that other embodiments may offer additional advantages, and not all advantages are necessarily disclosed herein, and that no particular advantage is required for all embodiments. For example, the processes disclosed in the present disclosure form a first MBC transistor that includes a first number of channel members and a second MBC transistor that includes a second number of channel members. The second number is greater than the first number. The first MBC transistor is better suited for high-speed applications and the second MBC transistor is better suited for high current applications.

In one exemplary aspect, the present disclosure is directed to a semiconductor device. The semiconductor device includes a first transistor and a second transistor. The first transistor includes two first source/drain features and a first number of nanostructures that are stacked vertically one over another and extend lengthwise between the two first source/drain features. The second transistor includes two second source/drain features and a second number of nanostructures that are stacked vertically one over another and extend lengthwise between the two second source/drain features. The first number is smaller than the second number.

In some embodiments, a bottommost nanostructure of the second number of nanostructures is lower than a bottommost nanostructure of the first number of nanostructures. In some embodiments, a bottom surface of one of the second source/drain features is lower than bottom surfaces of the first source/drain features. In some implementations, the semiconductor device may further include a first dummy epitaxial feature disposed below each of the two first source/drain features and a second dummy epitaxial feature disposed below at least one of the two second source/drain features. In some instances, the two first source/drain features and the two second source/drain features include a first semiconductor material and a first-type dopant and the first dummy epitaxial feature and the second dummy epitaxial feature include a second semiconductor material and are substantially free of the first-type dopant. In some instances, the first transistor further includes a first anti-punch-through (APT) feature disposed below the first number of nanostructures and the second transistor further includes a second APT feature disposed below the second number of nanostructures. In some embodiments, the first APT feature is in direct contact with the first dummy epitaxial feature and the second APT feature is in direct contact with the second dummy epitaxial feature. In some implementations, the second APT feature is lower than the first APT feature. In some instances, the first APT feature and the second APT feature include a second-type dopant different from the first-type dopant.

In another exemplary aspect, the present disclosure is directed to a semiconductor structure. The semiconductor structure may include a first number of channel members disposed over a first fin structure, a first gate structure wrapping around each of the first number of channel members, a second number of channel members disposed over a second fin structure, the second number being greater than the first number, a second gate structure wrapping around each of the second number of channel members, a dielectric fin disposed between the first gate structure and the second gate structure along a first direction, and an isolation feature disposed between the first fin structure and the second fin structure along the first direction. The dielectric fin includes a first bottom surface and a second bottom surface lower than the first bottom surface.

In some embodiments, the semiconductor structure may further include a gate cut feature disposed on the dielectric fin. In some implementations, the first bottom surface and the second bottom surface include a step change. In some embodiments, a top surface of the first fin structure is higher than a top surface of the second fin structure, the first bottom surface is coplanar with the top surface of the first fin structure, and the second bottom surface is coplanar with the top surface of the second fin structure. In some embodiments, the isolation feature includes a first top surface and a second top surface lower than the first top surface. In some implementations, the first top surface of the isolation feature interfaces the first bottom surface of the dielectric fin and the second top surface of the isolation feature interfaces the second bottom surface of the dielectric fin.

In yet another exemplary aspect, the present disclosure is directed to a method. The method includes providing a substrate including a first region and a second region, selectively forming a first anti-punch-through (APT) layer over the first region, selectively forming a second APT layer in the second region, depositing a first stack of semiconductor layers over the first region and the second region, selectively removing the first stack of semiconductor layers from the second region, after the selectively removing, selectively depositing a second stack of semiconductor layers over the second region, patterning the first stack of semiconductor layers and the second stack of semiconductor layers to form a first fin-shaped structure over the first region and a second fin-shaped structure over the second region, after the patterning, depositing an isolation feature over the substrate, and selectively etching back the isolation feature over the second region such that the isolation feature over the first region has a first thickness and the isolation feature over the second region has a second thickness smaller than the first thickness.

In some embodiments, the first stack of semiconductor layers includes a first number of silicon layers interleaved by first silicon germanium layers, the second stack of semiconductor layers includes a second number of silicon layers interleaved by second silicon germanium layers, and the second number is greater than the first number. In some implementations, the method may further include after the selectively etching back, forming a semiconductor cladding layer over the first fin-shaped structure and the second fin-shaped structure, forming a first dielectric fin over the isolation feature over the first region and a second dielectric fin over the isolation feature over the second region, forming a dummy gate stack over channel regions of the first fin-shaped structure and the second fin-shaped structure, selectively recessing source/drain regions of the first fin-shaped structure to form first source/drain recesses while the second region is covered, selectively recessing source/drain regions of the second fin-shaped structure to form second source/drain recesses while the first region is covered, and forming first source/drain features in the first source/drain recesses and second source/drain features in the second source/drain recesses. In some instances, the selectively recessing of the source/drain regions of the first fin-shaped structure removes the first APT layer in the first source/drain recesses and the selectively recessing of the source/drain regions of the second fin-shaped structure removes the second APT layer in the second source/drain recesses. In some embodiments, the method may further include before the forming of the first source/drain features and the second source/drain features, forming dummy epitaxial features in the first source/drain recesses and the second source/drain recesses.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first transistor comprising:
      two first source/drain features,
      a first number of nanostructures that are stacked vertically one over another and extend lengthwise between the two first source/drain features, and
      a first dummy epitaxial feature disposed below each of the two first source/drain features; and
   a second transistor comprising:
      two second source/drain features,
      a second number of nanostructures that are stacked vertically one over another and extend lengthwise between the two second source/drain features, and
      a second dummy epitaxial feature disposed below at least one of the two second source/drain features,
   wherein the first number is smaller than the second number.

2. The semiconductor device of claim 1, wherein a bottommost nanostructure of the second number of nanostructures is lower than a bottommost nanostructure of the first number of nanostructures.

3. The semiconductor device of claim 1, wherein a bottom surface of one the second source/drain features is lower than bottom surfaces of the second source/drain features.

4. The semiconductor device of claim 1,
   wherein the two first source/drain features and the two second source/drain features comprise a first semiconductor material and a first-type dopant,
   wherein the first dummy epitaxial feature and the second dummy epitaxial feature comprise a second semiconductor material and are substantially free of the first-type dopant.

5. The semiconductor device of claim 4,
   wherein the first transistor further comprises a first anti-punch-through (APT) feature disposed below the first number of nanostructures,
   wherein the second transistor further comprises a second APT feature disposed below the second number of nanostructures.

6. The semiconductor device of claim 5,
   wherein the first APT feature is in direct contact with the first dummy epitaxial feature,
   wherein the second APT feature is in direct contact with the second dummy epitaxial feature.

7. The semiconductor device of claim 5, wherein the second APT feature is lower than the first APT feature.

8. The semiconductor device of claim 5, wherein the first APT feature and the second APT feature comprise a second-type dopant different from the first-type dopant.

9. The semiconductor device of claim 1, further comprising:
   a semiconductor substrate disposed below the first number of nanostructures and the second number of nanostructures,
   wherein the first dummy epitaxial feature and the second dummy epitaxial feature are in direct contact with the semiconductor substrate.

10. A semiconductor structure, comprising:
    a first number of channel members disposed over a first fin structure;
    a first gate structure wrapping around each of the first number of channel members;
    a second number of channel members disposed over a second fin structure, the second number being greater than the first number;
    a second gate structure wrapping around each of the second number of channel members;
    a dielectric fin disposed between the first gate structure and the second gate structure along a first direction; and
    an isolation feature disposed between the first fin structure and the second fin structure along the first direction,
    wherein the dielectric fin comprises a first bottom surface and a second bottom surface lower than the first bottom surface.

11. The semiconductor structure of claim 10, further comprising a gate cut feature disposed on the dielectric fin.

12. The semiconductor structure of claim 10, wherein the first bottom surface and the second bottom surface comprise a step change.

13. The semiconductor structure of claim 10,
wherein a top surface of the first fin structure is higher than a top surface of the second fin structure,
wherein the first bottom surface is coplanar with the top surface of the first fin structure,
wherein the second bottom surface is coplanar with the top surface of the second fin structure.

14. The semiconductor structure of claim 13, wherein the isolation feature comprises a first top surface and a second top surface lower than the first top surface.

15. The semiconductor structure of claim 14,
wherein the first top surface of the isolation feature interfaces the first bottom surface of the dielectric fin,
wherein the second top surface of the isolation feature interfaces the second bottom surface of the dielectric fin.

16. A method, comprising:
providing a substrate comprising a first region and a second region;
selectively forming a first anti-punch-through (APT) layer over the first region;
selectively forming a second APT layer in the second region;
depositing a first stack of semiconductor layers over the first region and the second region;
selectively removing the first stack of semiconductor layers from the second region;
after the selectively removing, selectively depositing a second stack of semiconductor layers over the second region;
patterning the first stack of semiconductor layers and the second stack of semiconductor layers to form a first fin-shaped structure over the first region and a second fin-shaped structure over the second region;
after the patterning, depositing an isolation feature over the substrate; and
selectively etching back the isolation feature over the second region such that the isolation feature over the first region has a first thickness and the isolation feature over the second region has a second thickness smaller than the first thickness.

17. The method of claim 16,
wherein the first stack of semiconductor layers comprises a first number of silicon layers interleaved by first silicon germanium layers,
wherein the second stack of semiconductor layers comprises a second number of silicon layers interleaved by second silicon germanium layers,
wherein the second number is greater than the first number.

18. The method of claim 16, further comprising:
after the selectively etching back, forming a semiconductor cladding layer over the first fin-shaped structure and the second fin-shaped structure;
forming a first dielectric fin over the isolation feature over the first region and a second dielectric fin over the isolation feature over the second region;
forming a dummy gate stack over channel regions of the first fin-shaped structure and the second fin-shaped structure;
selectively recessing source/drain regions of the first fin-shaped structure to form first source/drain recesses while the second region is covered;
selectively recessing source/drain regions of the second fin-shaped structure to form second source/drain recesses while the first region is covered; and
forming first source/drain features in the first source/drain recesses and second source/drain features in the second source/drain recesses.

19. The method of claim 18,
wherein the selectively recessing of the source/drain regions of the first fin-shaped structure removes the first APT layer in the first source/drain recesses,
wherein the selectively recessing of the source/drain regions of the second fin-shaped structure removes the second APT layer in the second source/drain recesses.

20. The method of claim 18, further comprising:
before the forming of the first source/drain features and the second source/drain features, forming dummy epitaxial features in the first source/drain recesses and the second source/drain recesses.

* * * * *